United States Patent [19]

Ooishi et al.

[11] Patent Number: 5,760,614
[45] Date of Patent: Jun. 2, 1998

[54] POTENTIAL DETECTING CIRCUIT AND SEMICONDUCTOR INTEGRATED CIRCUIT

[75] Inventors: Tsukasa Ooishi; Hideto Hidaka; Mikio Asakura, all of Tokyo, Japan

[73] Assignee: Mitsubishi Denki Kabushiki Kaisha, Tokyo, Japan

[21] Appl. No.: 667,178

[22] Filed: Jun. 20, 1996

[30] Foreign Application Priority Data

Nov. 28, 1995 [JP] Japan .................................. 7-309610

[51] Int. Cl.⁶ .................................................. H03K 5/153
[52] U.S. Cl. ............................... 327/77; 327/81; 327/103
[58] Field of Search .................................. 327/77–81, 103, 327/534, 535, 537, 142, 143, 403, 404

[56] References Cited

U.S. PATENT DOCUMENTS

| | | | |
|---|---|---|---|
| 4,749,880 | 6/1988 | Kobatake | 327/78 |
| 4,812,681 | 3/1989 | Pumphrey | 327/77 |
| 4,964,082 | 10/1990 | Sato et al. | 327/534 |
| 5,113,088 | 5/1992 | Yamamoto et al. | 327/537 |
| 5,130,577 | 7/1992 | Neidorff et al. | 327/103 |
| 5,191,235 | 3/1993 | Hara | 327/534 |
| 5,243,228 | 9/1993 | Maruyama et al. | 327/534 |
| 5,270,583 | 12/1993 | Miyawaki et al. | 327/534 |
| 5,270,584 | 12/1993 | Koshikawa et al. | 327/534 |
| 5,278,458 | 1/1994 | Holland et al. | 327/77 |

*Primary Examiner*—Toan Tran
*Attorney, Agent, or Firm*—McDermott, Will & Emery

[57] ABSTRACT

A constant current source (1) is provided between a power supply (VCC) and an intermediate node (N1) and supplies a reference current (IR) which is a constant current between the power supply (VCC) and the intermediate node (N1). A variable resistor (2) is provided between the intermediate node (N1) and a comparison potential (VL) and its resistance value can be set to a desired value. A current flowing in the variable resistor (2) is a comparison current (IC). An amplifier (3) has an input connected to the intermediate node (N1) and amplifies a potential from the intermediate node (N1) to output a level detection signal (GE). Having this configuration, a potential detecting circuit which ensures a stable and controllable detection level is provided.

20 Claims, 13 Drawing Sheets

POTENTIAL DETECTING CIRCUIT AND SEMICONDUCTOR INTEGRATED CIRCUIT

BACKGROUND OF THE INVENTION

1. Field of the Invention

The present invention relates to a potential detecting circuit which determines whether a comparison potential reaches a prescribed detection level or not.

2. Description of the Background Art

FIG. 20 is a circuit diagram of a configuration of a potential detecting circuit in the background art. The background-art potential detecting circuit includes PMOS transistors 6a to 6d connected in series between a comparison potential VL and a ground level, and an inverter 7. The transistors 6a to 6d are each diode-connected. The inverter 7 consists of PMOS transistor 7a and an NMOS transistor 7b. The input of the inverter 7 (the gates of transistors 7a and 7b) is connected to a node NA which is the drain of transistor 6c placed third from the comparison potential VL.

In the background-art potential detecting circuit, a level detection signal GE of H-level is generated from a node NB when a potential at the node NA is lower than the logical threshold value of the inverter 7, and the level detection signal GE of L-level is generated when the potential at the node NA is higher than the logical threshold value of the inverter 7.

Since the background-art potential detecting circuit has the above configuration, the logical threshold value of the inverter 7 varies with a variation of a power supply potential VCC, to disadvantageously render the level detection signal GE unstable.

Moreover, a detection level for the comparison potential VL is disadvantageously not controllable since the comparison potential VL is applied to the node NA through the diode-connected three transistors 6a to 6c.

For the same reason, the detection level of the potential detecting circuit varies with a change of an operating temperature since the change of the operating temperature causes a variation in threshold voltage of the transistors 6a to 6c. In the potential detecting circuit, the variation in threshold voltage increases threefold since the three transistors are connected in series.

SUMMARY OF THE INVENTION

The present invention is directed to a potential detecting circuit which determines whether a comparison potential reaches a prescribed detection level or not. According to a first aspect of the present invention, the potential detecting circuit comprises: reference current supplying means for supplying a reference current; comparison current supplying means receiving the comparison potential, for supplying a comparison current, the amount of which is given by conversion of the comparison potential with a prescribed current conversion rate; an intermediate node provided between the reference current supplying means and the comparison current supplying means so that one of the reference current and the comparison current flows in and the other flows out; and level detection signal outputting means for outputting a level detection signal on the basis of a potential at the intermediate node. In the potential detecting circuit of the first aspect, the comparison current supplying means can set the prescribed current conversion rate to a desired value.

According to a second aspect of the present invention, in the potential detecting circuit of the first aspect, the reference current supplying means can set the amount of the reference current to a desired current amount.

According to a third aspect of the present invention, in the potential detecting circuit of the second aspect, the comparison current supplying means includes first current converting means receiving a first control signal and having a first current conversion rate which varies on the basis of the first control signal; and second current converting means receiving a second control signal and having a second current conversion rate which varies on the basis of the second control signal. The prescribed current conversion rate is a combination of the first current conversion rate and second current conversion rate.

According to a fourth aspect of the present invention, in the potential detecting circuit of the second aspect, the prescribed current conversion rate varies on the basis of a current conversion control signal. The potential detecting circuit further comprises: an external input terminal for receiving an externally-inputted signal; and selecting means receiving the externally-inputted signal through the external input terminal and a selection signal, for selecting the externally-inputted signal on the basis of the selection signal to output the selected externally-inputted signal as the current conversion control signal.

According to a fifth aspect of the present invention, the potential detecting circuit of the second aspect is connected to first and second power supplies, and in the potential detecting circuit of the second aspect, the reference current supplying means supplies the reference current between the intermediate node and the second power supply, and the comparison current supplying means includes a node for pre-comparison current; pre-comparison current supplying means receiving the comparison potential, for supplying a pre-comparison current, the amount of which is given by conversion from the comparison potential into current, between the node or pre-comparison current and the second power supply; and current mirror means for supplying the comparison current, the amount of which is in a prescribed proportion to the amount of the pre-comparison current, between the first power supply and the intermediate node in response to the pre-comparison current.

According to a sixth aspect of the present invention, the potential detecting circuit of the second aspect is connected to first and second power supplies, and in the potential detecting circuit of the second aspect, the comparison current supplying means supplies the comparison current between the intermediate node and the second power supply, and the reference current supplying means includes a node for constant current; constant current supplying means for supplying a constant current between the node for constant current and the second power supply; and current mirror means for supplying the reference current, the amount of which is in proportion to the amount of the constant current, between the first power supply and the intermediate node in response to the constant current.

According to a seventh aspect of the present invention, in the potential detecting circuit of the second aspect, the reference current supplying means receives a prospective set potential and supplies the reference current, the amount of which is given by conversion of the prospective set potential into current with the prescribed current conversion rate.

According to an eighth aspect of the present invention, the potential detecting circuit of the fifth aspect further comprises: second reference current supplying means for supplying a second reference current; second current mirror means for supplying a second comparison current, the amount of which is in proportion to the amount of the pre-comparison current with a second rate, in response to the pre-comparison current; a second intermediate node provided between the second reference current supplying means and the second current mirror means so that one of the second reference current and the second comparison current flows in and the other flows out; and second level detection signal outputting means for outputting a second level detection signal on the basis of a potential at the second intermediate node.

According to a ninth aspect of the present invention, in the potential detecting circuit of the fifth or sixth aspect, the level detection signal outputting means includes a differential amplifier circuit having a first input connected to the intermediate node and a second input supplied with a reference voltage, for outputting either a first logic H-level or a first logic L-level, a first logical potential difference existing therebetween, as an amplified signal on the basis of a difference between voltages received by the first and second inputs; logic inverting means receiving the amplified signal, for logically inverting the amplified signal with a logical threshold value in conformity with the first logic H-level or the first logic L-level to output an inverted amplified-signal; and level converter circuit receiving the amplified signal and the inverted amplified-signal, for outputting either a second logic H-level or a second logic L-level, a second logical potential difference larger than the first logical potential difference existing therebetween, as the level detection signal on the basis of a comparison result between the amplified signal and the inverted amplified-signal.

The present invention is also directed to a semiconductor integrated circuit. According to a tenth aspect of the present invention, the semiconductor integrated circuit comprises: voltage signal generating means receiving a voltage control signal, for generating a voltage signal on the basis of the voltage control signal; and first and second potential detecting circuits for determining whether a comparison potential which is a potential of the voltage signal reaches a prescribed detection level or not. In the semiconductor integrated circuit, the first and second potential detecting circuits each include reference current supplying means for supplying a reference current; comparison current supplying means receiving the comparison potential, for supplying a comparison current, the amount of which is given by conversion of the comparison potential with a prescribed current conversion rate; an intermediate node provided between the reference current supplying means and the comparison current supplying means so that one of the reference current and the comparison current flows in and the other flows out; and level detection signal outputting means for outputting a level detection signal on the basis of a potential at the intermediate node. The comparison current supplying means sets the prescribed current conversion rate to a desired value. The reference current supplying means of the second potential detecting circuit further receives a prospective set potential and supplies the reference current, the amount of which is given by conversion of the prospective set potential into current with the prescribed current conversion rate. The semiconductor integrated circuit of the tenth aspect further comprises: voltage control signal outputting means receiving an instruction signal, for outputting either of level detection signals from the first and second potential detecting circuits as the voltage control signal on the basis of the instruction signal.

According to an eleventh aspect of the present invention, the semiconductor integrated circuit comprises: the potential detecting circuit of the eighth aspect; first voltage generating means controlled whether to be active or non-active on the basis of the level detection signal, for generating a first voltage with a first current driving power in an active state; second voltage generating means controlled whether to be active or non-active on the basis of a second level detection signal, for generating a second voltage with a second current driving power larger than the first current driving power in an active state; and a substrate receiving the first and second voltages. In the semiconductor integrated circuit, a voltage of the substrate serves as the comparison potential.

In the potential detecting circuit of the first aspect of the present invention, since the comparison current supplying means can set the prescribed current conversion rate to a desired value, the detection level for the comparison potential can be variable by properly changing the prescribed current conversion rate.

Furthermore, since the reference current supplying means supplies a constant reference current, it is possible to always keep a stable detection level.

In the potential detecting circuit of the second aspect of the present invention, since the reference current supplying means can set the amount of the reference current to a desired current amount, the detection level for the comparison potential can be variable by properly changing the amount of the reference current.

The potential detecting circuit of the third aspect of the present invention can change the prescribed current conversion rate which is a combination of the first and second current conversion rates by changing the first and second current conversion rates in response to the first and second control signals.

In the potential detecting circuit of the fourth aspect of the present invention, the selecting means selects the externally-inputted signal on the basis of the selection signal to output the selected externally-inputted signal as the current conversion control signal.

Thus, since the potential detecting circuit of the fourth aspect supplies the externally-inputted signal, which is normally used for controlling the internal circuit, as the current conversion control signal, the prescribed current conversion rate can be externally changed without providing additional terminal for the externally-inputted signal.

In the potential detecting circuit of the fifth aspect of the present invention, the reference current supplying means supplies the reference current between the intermediate node and the ground level, and the comparison current supplying means includes the node for pre-comparison current, the pre-comparison current supplying means for supplying the pre-comparison current, the amount of which is given by conversion from the comparison potential into current, between the node for pre-comparison current and the second power supply, and the current mirror means for supplying the comparison current, the amount of which is in a prescribed proportion to the amount of the pre-comparison current, between the first power supply and the intermediate node in response to the pre-comparison current. With the reference current supplying means and the comparison current supplying means, the potential detecting circuit of the fifth aspect compares the amount of the comparison current with the amount of the reference current to output the level detection signal.

Moreover, since both the reference current and the pre-comparison current flow between the second power supply and the node (the intermediate node or the node for pre-comparison current), it is possible to avoid the respective amounts of the reference current and the pre-comparison current from being affected by the external noise by using the ground level which is unaffected by the external noise as the second power supply and so on. The amount of the comparison current provided by the current mirror means is accurately proportional to the amount of the pre-comparison current.

Thus, the potential detecting circuit of the fifth aspect achieves high accuracy in the respective amounts of the reference current and the comparison current against the external noise, and thereby outputs the level detection signal with high accuracy.

In the potential detecting circuit of the sixth aspect of the present invention, the comparison current supplying means supplies the comparison current between the intermediate node and the second power supply, and the reference current supplying means includes the node for constant current, the constant current supplying means for supplying the constant current between the node for constant current and the second power supply, and the current mirror means for supplying the reference current, the amount of which is in proportion to the amount of the constant current, between the first power supply and the intermediate node in response to the constant current. With the comparison current supplying means and the reference current supplying means, the potential detecting circuit of the sixth aspect compares the amount of the constant current with the amount of the reference current to output the level detection signal.

Moreover, since both the constant current and the comparison current are supplied between the second power supply and the node (the intermediate node or the node for constant current), it is possible to avoid the respective amounts of the constant current and the comparison current from being affected by the external noise by using the ground level which is unaffected by the external noise as the second power supply and so on. The amount of the reference current provided by the current mirror means is accurately proportional to the amount of the constant current.

Thus, the potential detecting circuit of the sixth aspect achieves high accuracy in the respective amounts of the reference current and the comparison current against the external noise, and thereby outputs the level detection signal with high accuracy.

Furthermore, the constant current has little variation in current amount, and accordingly the reference current provided by the current mirror means also has little variation in current amount and further there occurs no noise when the constant current is converted into the reference current by the current mirror means.

Thus, the potential detecting circuit of the sixth aspect achieves still higher accuracy in the respective amounts of the reference current and the comparison current against the external noise, and thereby outputs the level detection signal with still higher accuracy.

In the potential detecting circuit of the seventh aspect of the present invention, the reference current supplying means receives the prospective set potential and supplies the reference current, the amount of which is given by conversion of the prospective set potential into current with the prescribed current conversion rate, and therefore it is possible to change the detection level for the comparison potential only by changing the prospective set potential.

The potential detecting circuit of the eighth aspect of the present invention comprises the second reference current supplying means, the second current mirror means, the second intermediate node and the second level detection signal outputting means, and therefore it can output two detection signals of different levels, the level detection signal and the second level detection signal, for one comparison potential.

As a result, it is possible to determine whether the comparison potential reaches the two different detection levels at one time by setting the prescribed rate and the second rate to different values to render the respective amounts of the comparison current and the second comparison current different.

In the potential detecting circuit of the ninth aspect of the present invention, the level detection signal outputting means includes the differential amplifier circuit for outputting either the first logic H-level or the first logic L-level, the first logical potential difference existing therebetween, as the amplified signal, the logic inverting means for logically inverting the amplified signal with the logical threshold value in conformity with the first logic H-level or the first logic L-level to output the inverted amplified-signal, and the level converter circuit for outputting either the second logic H-level or the second logic L-level, the second logical potential difference larger than the first logical potential difference existing therebetween, as the level detection signal.

Thus, the logic inverting means has the logical threshold value in conformity with the first logic H-level or the first logic L-level of the differential amplifier circuit, and it is therefore possible to output the inverted amplified-signal without passing a needless through current even if the first logical potential difference of the differential amplifier circuit is small.

Consequently, the level detection signal of the second logical potential difference larger than the first logical potential difference of the differential amplifier circuit can be outputted from the level converter circuit with high accuracy.

The semiconductor integrated circuit of the tenth aspect of the present invention comprises the first and second potential detecting circuits and voltage control signal outputting means which outputs either of level detection signals from the first and second potential detecting circuits as the voltage control signal on the basis of the instruction signal. The voltage signal generating means generates the voltage signal on the basis of the voltage control signal.

Therefore, it is possible to control the voltage signal generated by the voltage signal generating means on the basis of either of level detection signals from the first and second potential detecting circuits in response to the instruction signal.

The semiconductor integrated circuit of the eleventh aspect of the present invention comprises the potential detecting circuit which outputs the level detection signal and the second level detection signal on the basis of the comparison potential, the first voltage generating means which is controlled whether to be active or non-active on the basis of the level detection signal and generates the first voltage with the first current driving power in an active state, the second voltage generating means which is controlled whether to be active or non-active on the basis of a second level detection signal and generates the second voltage with the second current driving power larger than the first current driving power in an active state, and the substrate which receives the first and second voltages, and uses the potential of the substrate as the above comparison potential.

Therefore, the semiconductor integrated circuit of the eleventh aspect can adjust the potential of the substrate to the desired prospective set potential quickly and accurately by rendering both or either of the first and second voltage generating means active in response to the level detection signal and the second level detection signal to change the current driving power of the voltage applied to the substrate.

An object of the present invention is to provide a potential detecting circuit which achieves a stable and controllable detection level.

These and other objects, features, aspects and advantages of the present invention will become more apparent from the following detailed description of the present invention when taken in conjunction with the accompanying drawings.

DESCRIPTION OF THE PREFERRED EMBODIMENTS

<The First Preferred Embodiment>

Figure 1A:
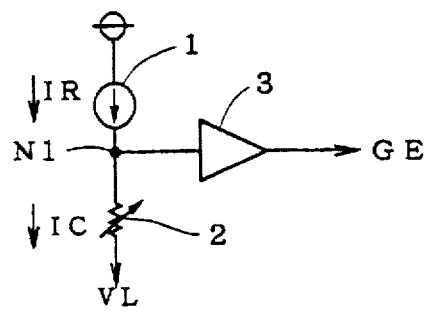
FIGS. 1A and 1B are circuit diagrams each showing a configuration of a potential detecting circuit in accordance with a first preferred embodiment of the present invention.
Figure 1B:
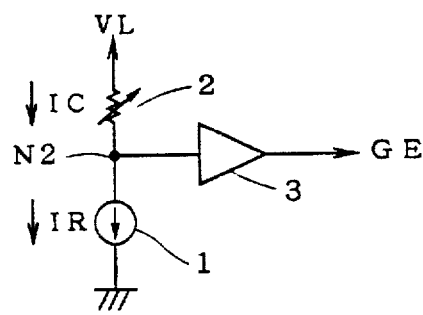

FIGS. 1A and 1B are circuit diagrams each showing a configuration of a potential detecting circuit in accordance with the first preferred embodiment of the present invention. The potential detecting circuit is a circuit which determines whether the comparison voltage VL reaches a prescribed detection level or not.

As shown in FIG. 1A, a constant current source 1 is provided between the power supply VCC and an intermediate node N1 and supplies a reference current IR which is a constant current between the power supply VCC and the intermediate node N1. A variable resistor 2 is provided between the intermediate node N1 and the comparison potential VL and its resistance value can be variable. A current flowing in the variable 2 is a comparison current IC. An amplifier 3 has an input connected to the intermediate node N1 and amplifies a potential from the intermediate node N1 to output the level detection signal GE.

In the potential detecting circuit having this configuration, when a difference between the comparison potential VL and the power supply potential VCC is small and the reference current IR is larger than the comparison current IC, the intermediate node N1 is charged and a potential at the intermediate node N1 becomes higher than a logical threshold value of the amplifier 3. Consequently, the amplifier 3 outputs the level detection signal GE of H-level.

On the other hand, when a difference between the comparison potential VL and the power supply potential VCC is large and the comparison current IC is larger than the reference current IR, the intermediate node N1 is discharged and a potential at the intermediate node N1 becomes lower than the logical threshold value of the amplifier 3. Consequently, the amplifier 3 outputs the level detection signal GE of L-level.

Thus, it is possible to determine whether the comparison potential VL reaches the prescribed detection level or not depending on whether the level detection signal GE is H-level or L-level. The detection level is changeable by changing a current conversion rate with which the comparison potential VL is converted into the comparison current IC through changing the resistance value of the variable resistor 2.

As shown in FIG. 1B, the constant current source 1 is provided between the ground level and an intermediate node N2 and supplies the reference current IR which is a constant current between the intermediate node N2 and the ground level. The variable resistor 2 is provided between the intermediate node N2 and the comparison potential VL and its resistance value can be variable. A current flowing in the variable resistor 2 is the comparison current IC. The amplifier 3 has the input connected to the intermediate node N2 and amplifies a potential from the intermediate node N2 to output the level detection signal GE.

In the potential detecting circuit having this configuration, when a difference between the comparison potential VL and the ground level potential is small and the reference current IR is larger than the comparison current IC, the intermediate node N2 is discharged and a potential at the intermediate node N2 becomes lower than the logical threshold value of the amplifier 3. Consequently, the amplifier 3 outputs the level detection signal GE of L-level.

On the other hand, when a difference between the comparison potential VL and the ground level potential is large and the comparison current IC is larger than the reference current IR, the intermediate node N2 is charged and a potential at the intermediate node N2 becomes higher than the logical threshold value of the amplifier 3. Consequently, the amplifier 3 outputs the level detection signal GE of H-level.

Thus, it is possible to determine whether the comparison potential VL reaches the prescribed detection level or not depending on whether the level detection signal GE is H-level or L-level. The detection level is changeable by changing the current conversion rate with which the comparison potential VL is converted into the comparison current IC through changing the resistance value of the variable resistor 2.

As discussed above, in the potential detecting circuit of the first preferred embodiment, since the variable resistor 2 can set its resistance value to a desired value, with which the comparison potential VL is converted into current, the detection level for the comparison potential VL is changeable by appropriately changing the resistance value of the variable resistor 2.

Since the reference current IR which is supplied between the power supply VCC and the intermediate node N1 or between the intermediate node N2 and the ground level is constant, the detection level is stable even if the power supply potential VCC varies.

Figure 2A:
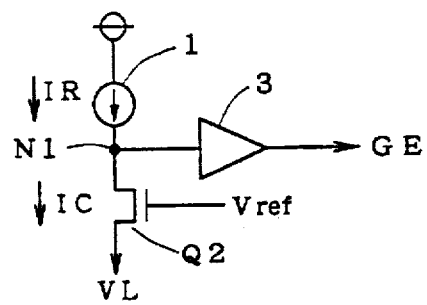
FIGS. 2A and 2B are circuit diagrams each showing another configuration of the potential detecting circuit in accordance with the first preferred embodiment of the present invention.

Furthermore, as shown in FIG. 2A, an NMOS transistor Q2 having a gate receiving a reference potential Vref, a drain connected to the intermediate node N1 and a source receiving the comparison potential VL may be employed, instead of the variable resistor 2 of FIG. 1A. In this case, the detection level for the comparison potential VL rises as the reference potential Vref rises, and the detection level for the comparison potential VL falls as the reference potential Vref falls.

Figure 2B:
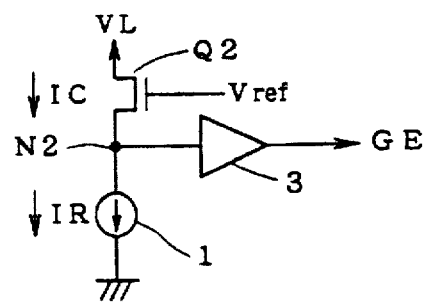

Similarly, as shown in FIG. 2B, a PMOS transistor Q4 having a gate receiving the reference potential Vref, a drain connected to the intermediate node N2 and a source receiving the comparison potential VL may be employed, instead of the variable resistor 2 of FIG. 1B. In this case, the detection level for the comparison potential VL rises as the reference potential Vref rises, and the detection level for the comparison potential VL falls as the reference potential Vref falls.

<The Second Preferred Embodiment>

Figure 3A:
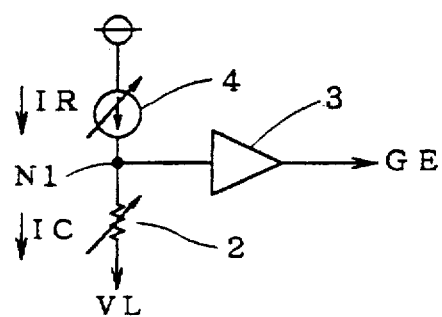
FIGS. 3A and 3B are circuit diagrams each showing a configuration of a potential detecting circuit in accordance with a second preferred embodiment of the present invention.
Figure 3B:
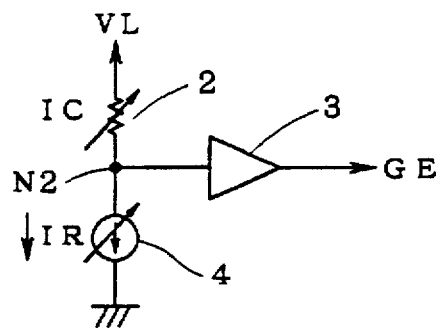

FIGS. 3A and 3B are circuit diagrams each showing a configuration of a potential detecting circuit in accordance with the second preferred embodiment of the present invention.

As shown in FIG. 3A, a variable current source 4 is provided between the power supply VCC and the intermediate node N1 and supplies the reference current IR between the power supply VCC and the intermediate node N1. The amount of the reference current IR can be variable. The variable resistor 2 is provided between the intermediate node N1 and the comparison potential VL and its resistance value can be variable. The amplifier 3 has the input connected to the intermediate node N1 and amplifies a potential from the intermediate node N1 to output the level detection signal GE.

As shown in FIG. 3B, the variable current source 4 is provided between the ground level and the intermediate node N2 and supplies the reference current IR between the intermediate node N2 and the ground level. The variable resistor 2 is provided between the intermediate node N2 and the comparison potential VL and its resistance value can be variable. The amplifier 3 has the input connected to the intermediate node N2 and amplifies a potential from the intermediate node N2 to output the level detection signal GE.

The potential detecting circuit of the second preferred embodiment having this configuration, like that of the first preferred embodiment, can determine whether the comparison potential VL reaches the prescribed detection level or not depending on whether the level detection signal GE is H-level or L-level. The detection level for the comparison potential VL is changeable by changing the current conversion rate with which the comparison potential VL is converted into the comparison current IC through changing the resistance value of the variable resistor 2 or by changing the amount of the reference current IR of the variable current source 4.

<The Third Preferred Embodiment>

<The First Aspect>

Figure 4:
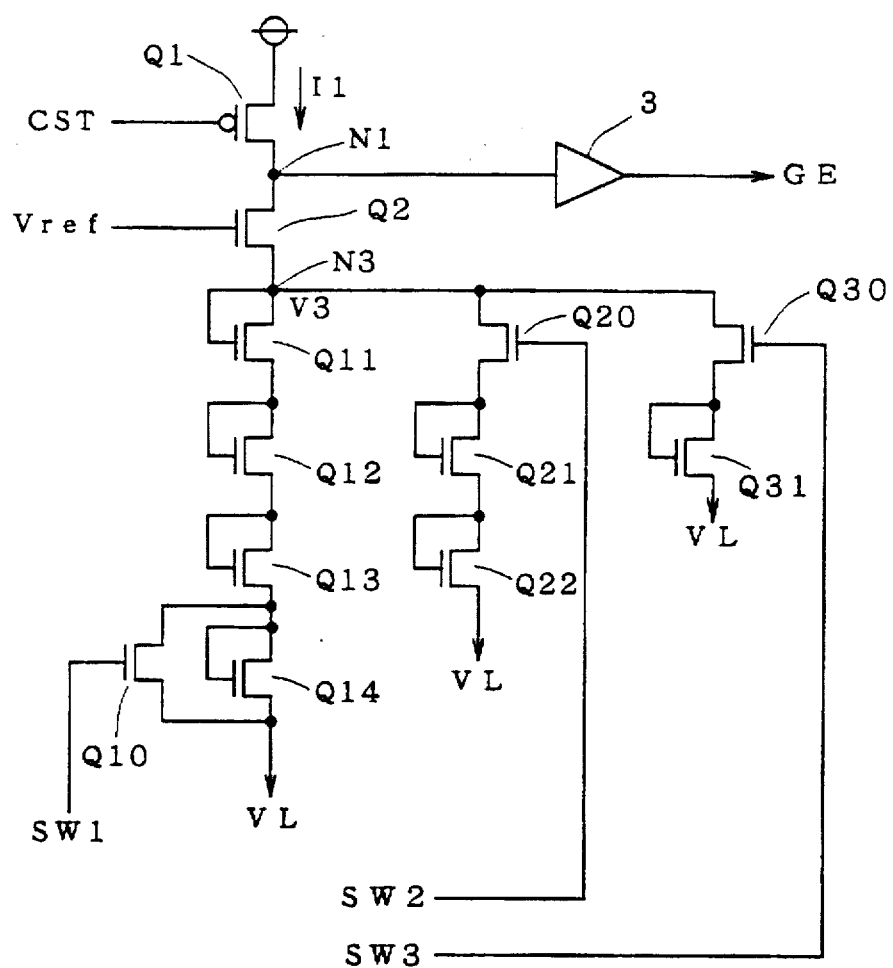
FIG. 4 is a circuit diagram of a configuration of a potential detecting circuit in accordance with a first aspect of a third preferred embodiment of the present invention.

FIG. 4 is a circuit diagram of a configuration of a potential detecting circuit in accordance with the first aspect of the third preferred embodiment of the present invention. As shown in FIG. 4, a PMOS transistor Q1 serving as a variable current source is interposed between the power supply VCC and the intermediate node N1 and its gate receives a control signal CST. The PMOS transistor Q1 supplies the reference current IR between the power supply VCC and the intermediate node N1 on the basis of the potential of the control signal CST.

The intermediate node N1 is connected to the drain of NMOS transistor Q2, and the gate of NMOS transistor Q2 is supplied with the reference potential Vref. The source of NMOS transistor Q2 is connected to a group of diode-connected NMOS transistors Q11 to Q14 which are connected in series, a group of diode-connected NMOS transistors Q21 and Q22 which are connected in series to each other through an NMOS transistor Q20 and a diode-connected NMOS transistor Q31 through an NMOS transistor Q30.

The comparison potential VL is supplied to the sources of NMOS transistors Q14, Q22 and Q31. An NMOS transistor Q10 is connected in parallel to the NMOS transistor Q14. Switching signals SW1 to SW3 are applied to the gates of NMOS transistors Q10, Q20 and Q30, respectively. The diode-connected transistors Q11 to Q14, Q21, Q22 and Q31 have the same threshold voltage. The control transistors Q10, Q20 and Q30 each have a resistance element of "0" in an on-state.

The amplifier 3 has the input connected to the intermediate node N1 and amplifies a potential from the intermediate node N1 to output the level detection signal GE.

In the potential detecting circuit having this configuration, the reference potential Vref is internally set, and the amount of the current flowing in the NMOS transistor Q2 is controlled on the basis of the reference potential Vref. The amount of the current flowing in the NMOS transistor Q2 increases as the reference potential Vref rises, and the detection level for a potential V3 at a node N3 rises by the increase in the current amount. Similarly, the detection level for the potential V3 falls as the reference potential Vref falls.

A difference between the potential V3 and the comparison potential VL (V3–VL) depends on the switching signals SW1 to SW3. Specifically, if the switching signals SW1 to SW3 are set in H, L and L, respectively, the NMOS transistor Q10 turns on and the NMOS transistors Q20 and Q30 turn off. Then, the potential difference (V3–VL) corresponds to a voltage drop of the four diode-connected NMOS transistors Q11 to Q14.

If the switching signals SW1 to SW3 are set in L, L and L, the NMOS transistors Q10, Q20 and Q30 turn off and then the potential difference (V3–VL) corresponds to a voltage drop of the three diode-connected NMOS transistors Q11 to Q13.

If the switching signals SW1 to SW3 are set in L, H and L, the NMOS transistor Q20 turns on and the NMOS transistors Q10 and Q30 turn off and then the potential difference (V3–VL) corresponds to a voltage drop of the two diode-connected NMOS transistors Q21 to Q22.

If the switching signals SW1 to SW3 are set in L, L and H, the NMOS transistor Q30 turns on and the NMOS transistors Q10 and Q20 turn off and then the potential difference (V3–VL) corresponds to a voltage drop of the diode-connected NMOS transistor Q31.

Thus, the potential detecting circuit of the first aspect of the third preferred embodiment determines a bias potential (V3–VL) of the potential V3 relative to the comparison potential VL depending on the switching signals SW1 to SW3 and controls the detection level for the potential V3, thereby eventually changing the detection level for the comparison potential VL.

<The Second Aspect>

Figure 5:
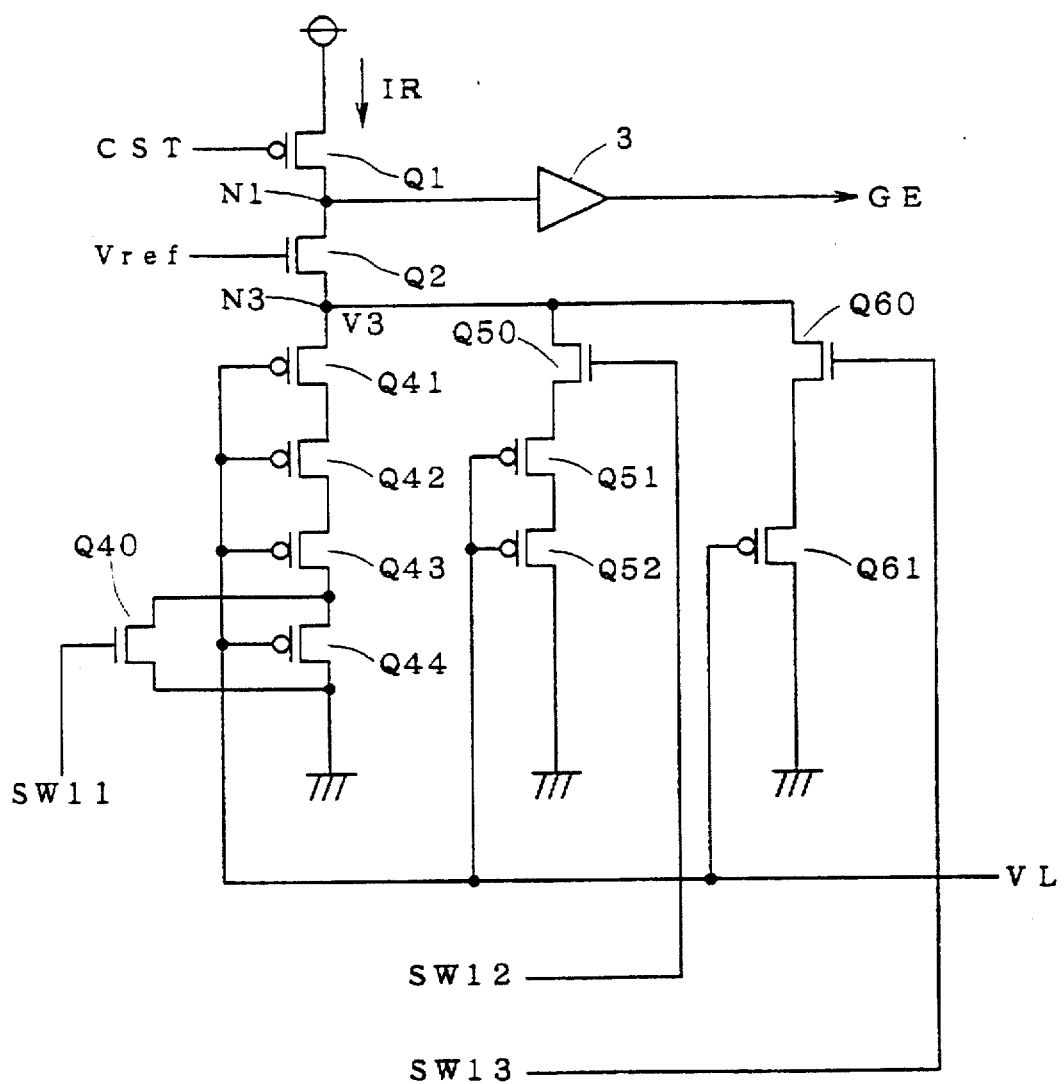
FIG. 5 is a circuit diagram of a configuration of a potential detecting circuit in accordance with a second aspect of the third preferred embodiment of the present invention.

FIG. 5 is a circuit diagram of a configuration of a potential detecting circuit in accordance with the second aspect of the third preferred embodiment of the present invention. As shown in FIG. 5, the PMOS transistor Q1 serving as a variable current source is interposed between the power supply VCC and the intermediate node N1 and its gate receives the control signal CST. The PMOS transistor Q1 supplies the reference current IR between the power supply VCC and the intermediate node N1 on the basis of the potential of the control signal CST.

The intermediate node N1 is connected to the drain of NMOS transistor Q2, and the gate of NMOS transistor Q2 is supplied with the reference potential Vref. The source of NMOS transistor Q2 is connected to a group of PMOS transistors Q41 to Q44 which are connected in series, a group of PMOS transistors Q51 and Q52 which are connected in series to each other through an NMOS transistor Q50 and a PMOS transistor Q61 through an NMOS transistor Q60.

The drains of PMOS transistors Q44, Q52 and Q61 are grounded and the comparison potential VL is supplied to the gates of PMOS transistors Q41 to Q44, Q51, Q52 and Q61.

An NMOS transistor Q40 is connected in parallel to the PMOS transistor Q44. Switching signals SW11 to SW13 are applied to the gates of NMOS transistors Q40, Q50 and Q60, respectively. The serially-connected PMOS transistors Q41 to Q44, Q51 and Q52, and Q61 have the same configuration. Each resistance element of the control transistors Q40, Q50 and Q60 in an on-state is negligible.

The amplifier 3 has the input connected to the intermediate node N1 and amplifies a potential from the intermediate node N1 to output the level detection signal GE.

In the potential detecting circuit having this configuration, the reference potential Vref is internally set, and the amount of the current flowing in the NMOS transistor Q2 is controlled on the basis of the reference potential Vref. The amount of the current flowing in the NMOS transistor Q2 increases as the reference potential Vref rises, and the detection level for the potential V3 at the node N3 rises by the increase in current amount. Similarly, the detection level for the potential V3 falls as the reference potential Vref falls.

The on-resistance value of the PMOS transistors Q41 to Q44, Q51, Q52 and Q61 depends on the comparison potential VL applied to their gates. Specifically, the lower the comparison potential VL is, the lower the on-resistance value becomes. The on-resistance value of the PMOS transistor, with the comparison potential VL applied thereto, is herein represented by RL.

Further, the value of a resistance R3 existing between the node N3 and the ground level depends on the switching signals SW11 to SW13. Specifically, if the switching signals SW11 to SW13 are set in H, L and L, respectively, the NMOS transistor Q40 turns on and the NMOS transistors Q50 and Q60 turn off. Then, the serially-connected four PMOS transistors Q41 to Q44 serve as the resistance and its resistance value is expressed as R3=4·RL.

If the switching signals SW11 to SW13 are set in L, L and L, the NMOS transistors Q40, Q50 and Q60 turn off and then the serially-connected three PMOS transistors Q41 to Q43 serve as the resistance and its resistance value is expressed as R3=3·RL.

If the switching signals SW11 to SW13 are set in L, H and L, the NMOS transistor Q50 turns on and the NMOS transistors Q40 and Q60 turn off and then the serially-connected two PMOS transistors Q51 and Q52 serve as the resistance and its resistance value is expressed as R3=2·RL.

If the switching signals SW11 to SW13 are set in L, L and H, the NMOS transistor Q60 turns on and the NMOS transistors Q40 and Q50 turn off and then the PMOS transistors Q61 serves as the resistance and its resistance value is expressed as R3=RL.

Thus, the potential detecting circuit of the second aspect of the third preferred embodiment determines the on-resistance value RL of the PMOS transistors provided between the node N3 and the ground level depending on the comparison potential VL applied thereto, and using the on-resistance value RL, it determines the resistance value R3 between the node N3 and the ground level depending on the switching signals SW11 to SW13. Further, it controls the detection level for the potential V3 with the NMOS transistor Q2 which receives the reference potential Vref, thus changing the detection level for the comparison potential VL. The comparison potential VL is limited herein to a negative potential.

<The Third Aspect>

Figure 6:
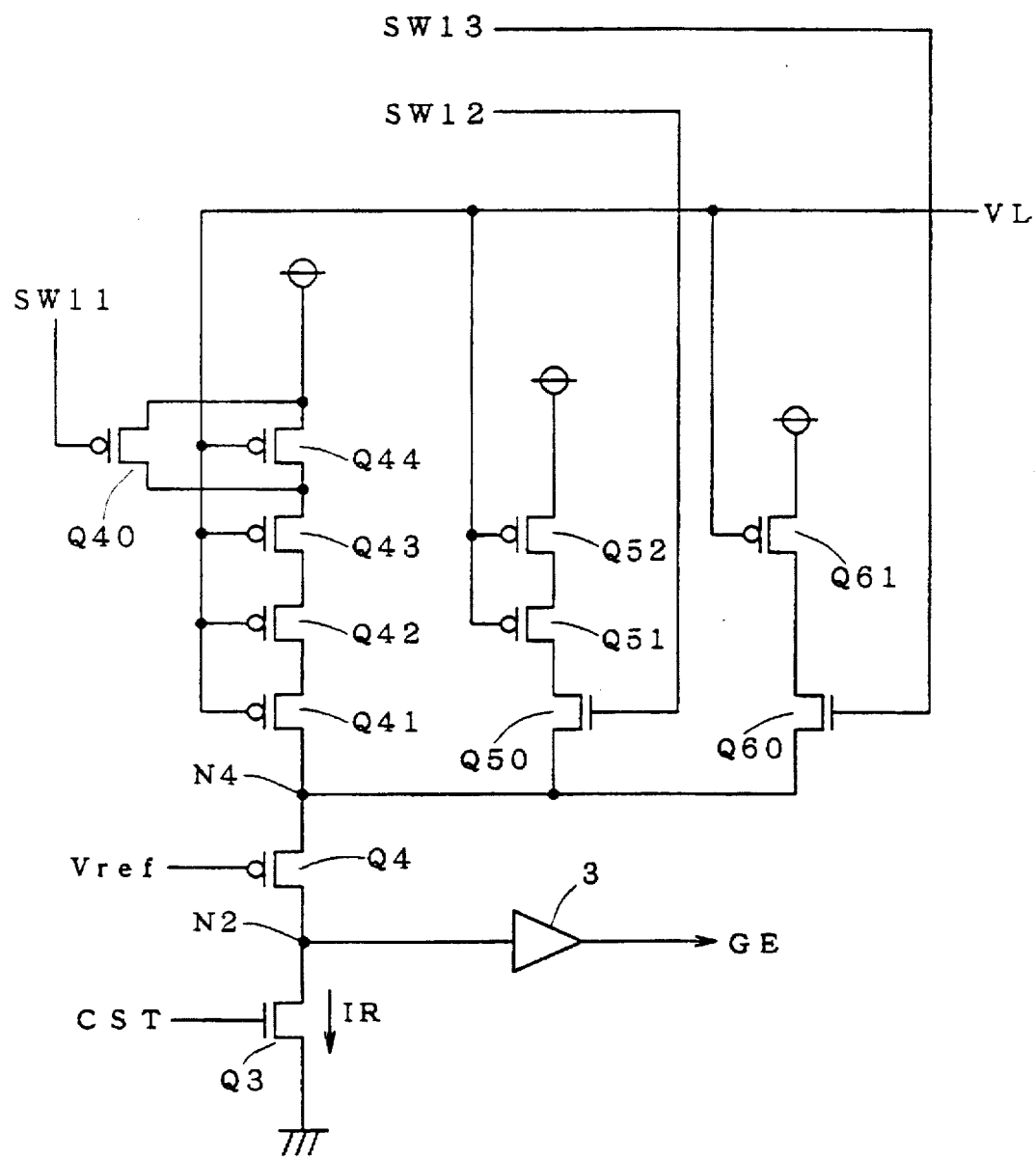
FIG. 6 is a circuit diagram of a configuration of a potential detecting circuit in accordance with a third aspect of the third preferred embodiment of the present invention.

FIG. 6 is a circuit diagram of a configuration of a potential detecting circuit in accordance with the third aspect of the third preferred embodiment of the present invention. As shown in FIG. 6, an NMOS transistor Q3 serving as a variable current source is interposed between the ground level and the intermediate node N2 and its gate receives the control signal CST. The NMOS transistor Q3 supplies the reference current IR between the intermediate node N2 and the ground level on the basis of the potential of the control signal CST.

The intermediate node N2 is connected to the drain of PMOS transistor Q4, and the gate of PMOS transistor Q4 is supplied with the reference potential Vref. The source of PMOS transistor Q4 is connected to the group of PMOS transistors Q41 to Q44 which are connected in series, the group of PMOS transistors Q51 and Q52 which are connected in series to each other through the NMOS transistor Q50 and the PMOS transistor Q61 through the NMOS transistor Q60.

The drains of PMOS transistors Q44, Q52 and Q61 are connected to the power supply VCC and the comparison potential VL is supplied to the gates of the PMOS transistors Q41 to Q44, Q51, Q52 and Q61.

The NMOS transistor Q40 is connected in parallel to the PMOS transistor Q44. Switching signals SW11 to SW13 are applied to the gates of NMOS transistors Q40, Q50 and Q60, respectively. The serially-connected PMOS transistors Q41 to Q44, Q51 and Q52, and Q61 have the same configuration. Each resistance element of the control transistors Q40, Q50 and Q60 in an on-state is negligible.

The amplifier 3 has the input connected to the intermediate node N2 and amplifies a potential from the intermediate node N2 to output the level detection signal GE.

In the potential detecting circuit having this configuration, the reference potential Vref is internally set, and the amount of the current flowing in the PMOS transistor Q4 is controlled on the basis of the reference potential Vref. The amount of the current flowing in the PMOS transistor Q4 increases as the reference potential Vref falls, and the detection level for a potential V4 at a node N4 rises by the increase in current amount. Similarly, the detection level for the potential V4 falls as the reference potential Vref rises.

The on-resistance value of the PMOS transistors Q41 to Q44, Q51, Q52 and Q61 depends on the comparison potential VL applied to their gates. Specifically, the lower the comparison potential VL is, the lower the on-resistance value becomes. The on-resistance value of the PMOS transistor, with the comparison potential VL applied thereto, is herein represented by RL.

Thus, the potential detecting circuit of the third aspect of the third preferred embodiment determines the on-resistance value RL of the PMOS transistors provided between the node N4 and the power supply VCC depending on the comparison potential VL applied thereto, and using the on-resistance value RL, it determines the resistance value R3 between the power supply VCC and the node N4 depending on the switching signals SW11 to SW13. Further, it controls the detection level for the potential V4 with the PMOS transistor Q4 which receives the reference potential Vref, thus changing the detection level for the comparison potential VL. The comparison potential VL only has not to be more than the power supply potential VCC.

Furthermore, adopting transistors of opposite conductive type and replacing the power supply VCC and the ground level with each other in the respective configurations of the above-discussed first to third aspects of the third preferred embodiment may provide a potential detecting circuit which detects the comparison potential VL higher than the power supply potential VCC.

<The Fourth Preferred Embodiment>

Figure 7:
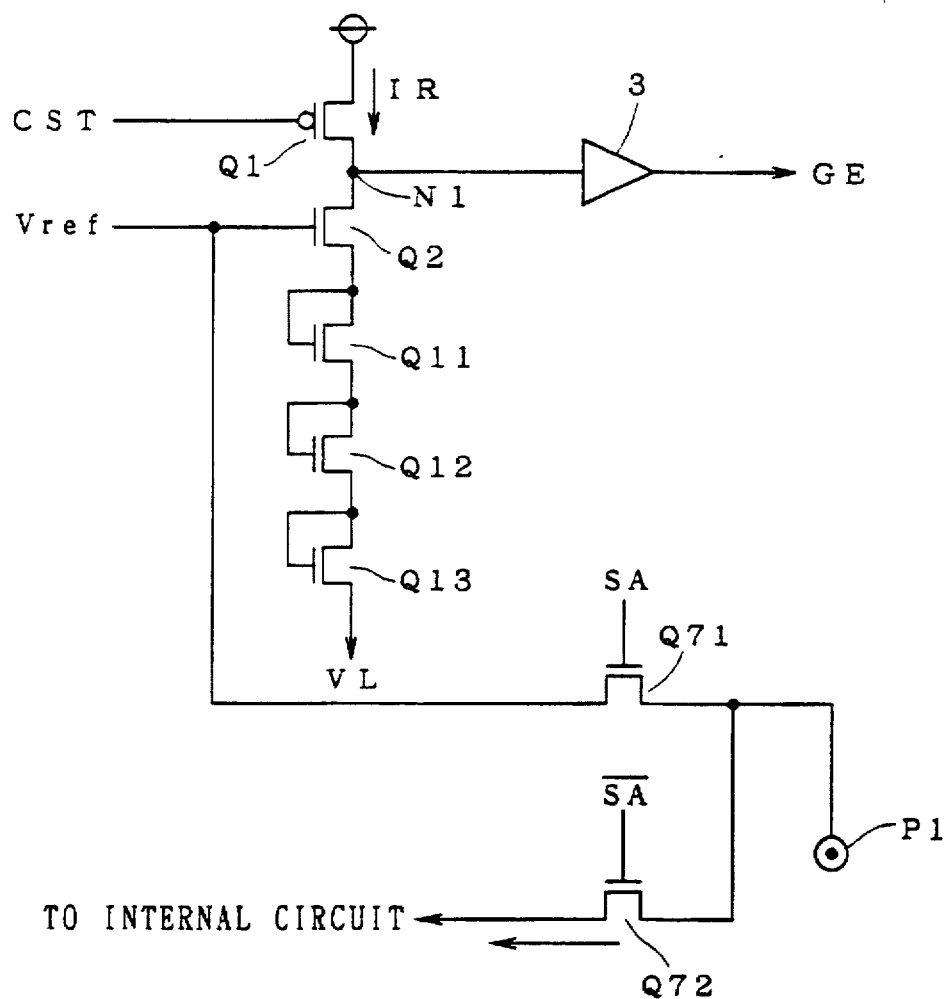
FIG. 7 is a circuit diagram of a configuration of a potential detecting circuit in accordance with a fourth preferred embodiment of the present invention.

FIG. 7 is a circuit diagram of a configuration of a potential detecting circuit in accordance with the fourth preferred embodiment of the present invention. As shown in FIG. 7, the PMOS transistor Q1 serving as a variable current source is interposed between the power supply VCC and the intermediate node N1 and its gate receives the control signal CST. The PMOS transistor Q1 supplies the reference current IR between the power supply VCC and the intermediate node N1 on the basis of the potential of the control signal CST.

The intermediate node N1 is connected to the drain of NMOS transistor Q2, and the gate of NMOS transistor Q2 is supplied with the reference potential Vref. The source of NMOS transistor Q2 is connected to a group of diode-connected NMOS transistors Q11 to Q13 which are connected in series. The comparison potential VL is supplied to the source of NMOS transistor Q13.

The amplifier 3 has the input connected to the intermediate node N1 and amplifies a potential from the intermediate node N1 to output the level detection signal GE.

The gate of NMOS transistor Q2 is also connected to a signal input pad P1 through an NMOS transistor Q71. The signal input pad P1 is also connected to an internal circuit through an NMOS transistor Q72. Switching signals SA and $\overline{SA}$ are applied to the gates of NMOS transistors Q71 and Q72, respectively.

In a normal operation, the switching signal SA is L-level, and the NMOS transistor Q71 turns off and the NMOS transistor Q72 turns on. An externally-inputted signal for controlling an operation of the internal circuit is applied to the signal input pad P1 and transmitted to the internal circuit through the NMOS transistor Q72.

At this time, the reference potential Vref is set by an internal signal and the amount of the current flowing in the NMOS transistor Q2 is controlled on the basis of the reference potential Vref. The amount of the current flowing in the NMOS transistor Q2 increases as the reference potential Vref rises, and the detection level for the comparison potential VL rises by the increase in current amount.

In an externally-controlled operation, the switching signal SA is H-level, and the NMOS transistor Q71 turns on and the NMOS transistor Q72 turns off. An externally-inputted signal for setting the reference potential Vref is applied to the signal input pad P1 and transmitted to the gate of NMOS transistor Q2 through the NMOS transistor Q71.

At this time, if the driving power of the externally-inputted signal is sufficiently larger than that of the internal signal, the reference potential Vref is set by the externally-inputted signal and the amount of the current flowing in the NMOS transistor Q2 is controlled on the basis of the reference potential Vref.

Thus, since the externally-inputted signal, which is usually used for controlling the operation of the internal circuit, serves as a control signal for setting the reference potential Vref, the amount of the current flowing in the NMOS transistor Q2 can be changed without providing an extra terminal for receiving another externally-inputted signal.

<The Fifth Preferred Embodiment>

<The First Aspect>

Figure 8:
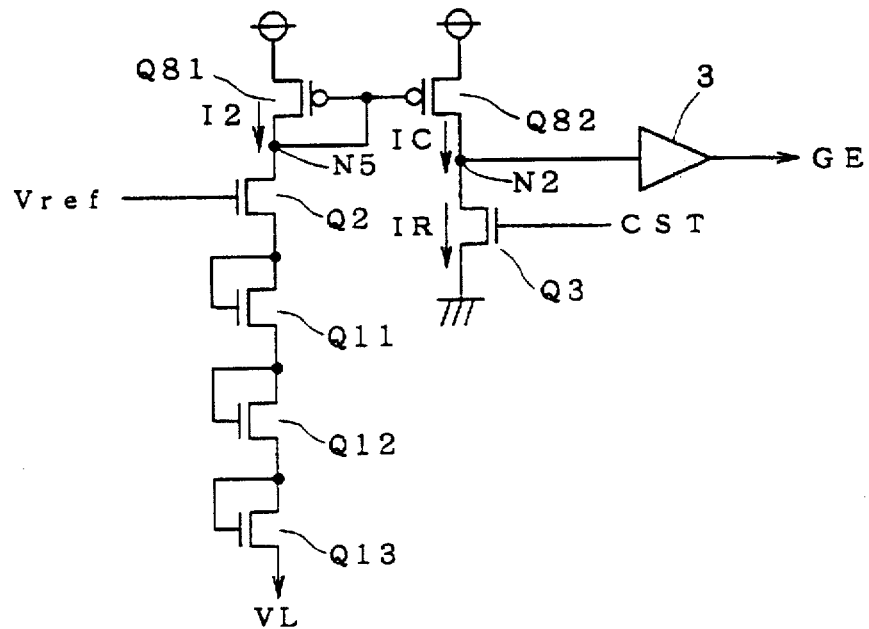
FIG. 8 is a circuit diagram of a configuration of a potential detecting circuit in accordance with a first aspect of a fifth preferred embodiment of the present invention.

FIG. 8 is a circuit diagram of a configuration of a potential detecting circuit in accordance with the first aspect of the fifth preferred embodiment of the present invention. As shown in FIG. 8, PMOS transistors Q81 and Q82, having sources connected to the power supply VCC and sharing a gate, constitute a current mirror circuit. The PMOS transistor Q81 has a connected gate and drain, and the drain of PMOS transistor Q81 is connected to a detection node N5. The drain of PMOS transistor Q82 is connected to the intermediate node N2.

The NMOS transistor Q3 serving as a variable current source is interposed between the ground level and the intermediate node N2 and its gate receives the control signal CST. The NMOS transistor Q3 supplies the reference current IR between the intermediate node N2 and the ground level on the basis of the potential of the control signal CST.

The detection node N5 is connected to the drain of NMOS transistor Q2, and the gate of NMOS transistor Q2 is supplied with the reference potential Vref. The source of NMOS transistor Q2 is connected to the group of diode-connected NMOS transistors Q11 to Q13 which are connected in series. The comparison potential VL is supplied to the source of NMOS transistor Q13.

The amplifier 3 has the input connected to the intermediate node N2 tand amplifies a potential from the intermediate node N2 to output the level detection signal GE.

In the potential detecting circuit having this configuration, the reference potential Vref is set by the internal signal and the amount of a pre-comparison current I2 flowing in the NMOS transistor Q2 is controlled on the basis of the reference potential Vref. The amount of the pre-comparison current I2 increases as the reference potential Vref rises, and the detection level for the comparison potential VL rises by the increase in current amount. The pre-comparison current I2 is supplied between the detection node N5 and the comparison potential VL, in other words, supplied towards the ground level.

With the current mirror circuit consisting of the PMOS transistors Q81 and Q82, a comparison current IC, the amount of which is in proportion to the amount of the pre-comparison current I2, flows from the power supply VCC to the intermediate node N2.

Therefore, if the difference between the comparison potential VL and the power supply potential VCC is small and the reference current IR is larger than the comparison current IC, the intermediate node N2 is discharged and the potential at the intermediate node N2 becomes lower than the logical threshold value of the amplifier 3. Consequently, the amplifier outputs the level detection signal GE of L-level.

On the other hand, if the difference between the comparison potential VL and the power supply potential VCC is large and the comparison current IC is larger than the reference current IR, the intermediate node N2 is charged and the potential at the intermediate node N2 becomes higher than the logical threshold value of the amplifier 3. Consequently, the amplifier 3 outputs the level detection signal GE of H-level.

Thus, it is possible to determine whether the comparison potential VL reaches the prescribed detection level or not depending on whether the level detection signal GE is H-level or L-level. The detection level is changeable by changing the pre-comparison current I2 flowing in the NMOS transistor Q2 on the basis of the reference potential Vref.

Moreover, since both the reference current IR and the pre-comparison current I2 flow from the nodes (the intermediate node N2 or the detection node N5) to the ground level which is unaffected by an external noise, the respective amounts of the reference current IR and the pre-comparison current I2 are unaffected by the external noise. The amount of the comparison current IC provided by the current mirror circuit is accurately proportional to the amount of the pre-comparison current I2.

As a result, the potential detecting circuit of the first aspect of the fifth preferred embodiment achieves high accuracy in the respective amounts of the reference current IR and the comparison current IC against the external noise, thereby outputting the level detection signal with high accuracy.

<The Second Aspect>

Figure 9:
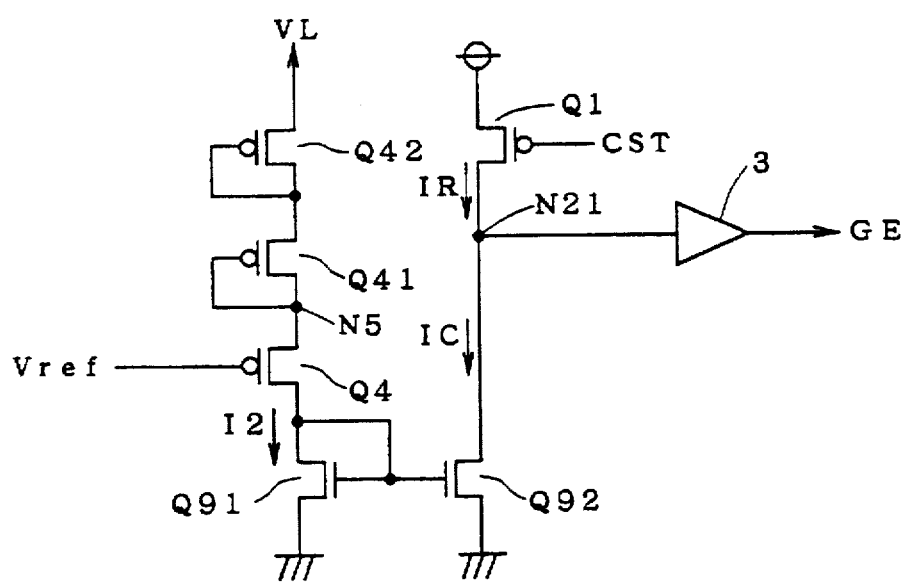
FIG. 9 is a circuit diagram of a configuration of a potential detecting circuit in accordance with a second aspect of the fifth preferred embodiment of the present invention.

FIG. 9 is a circuit diagram of a configuration of a potential detecting circuit in accordance with the second aspect of the fifth preferred embodiment of the present invention. As shown in FIG. 9, NMOS transistors Q91 and Q92, having sources connected to the ground level and sharing a gate, constitute a current mirror circuit. The NMOS transistor Q91 has a connected gate and drain, and the drain of NMOS transistor Q91 is connected to the detection node N5. The drain of NMOS transistor Q92 is connected to the intermediate node N1.

The PMOS transistor Q1 serving as a variable current source is interposed between the intermediate node N1 and the power supply VCC and its gate receives the control signal CST. The PMOS transistor Q1 supplies the reference current IR between the power supply VCC and the intermediate node N1 on the basis of the potential of the control signal CST.

The detection node N5 is connected to the drain of PMOS transistor Q4 and the gate of PMOS transistor Q4 is supplied with the reference potential Vref. The source of PMOS transistor Q4 is connected to the group of diode-connected PMOS transistors Q41 and Q42 which are connected in series. The comparison potential VL is supplied to the source of PMOS transistor Q42.

The amplifier 3 has the input connected to the intermediate node N1 and amplifies a potential from the intermediate node N1 to output the level detection signal GE.

In the potential detecting circuit having this configuration, like that of the first aspect, it is possible to determine whether the comparison potential VL reaches the prescribed detection level or not depending on whether the level detection signal GE is H-level or L-level. The detection level is changeable by changing the pre-comparison current I2 flowing in the PMOS transistor Q4 on the basis of the reference potential Vref.

Furthermore, the potential detecting circuit of the second aspect is suitable for a case of detection using a relatively high detection level and that of the first aspect is suitable for a case of detection using a relatively low detection level.

<The Sixth Preferred Embodiment>

<The First Aspect>

Figure 10:
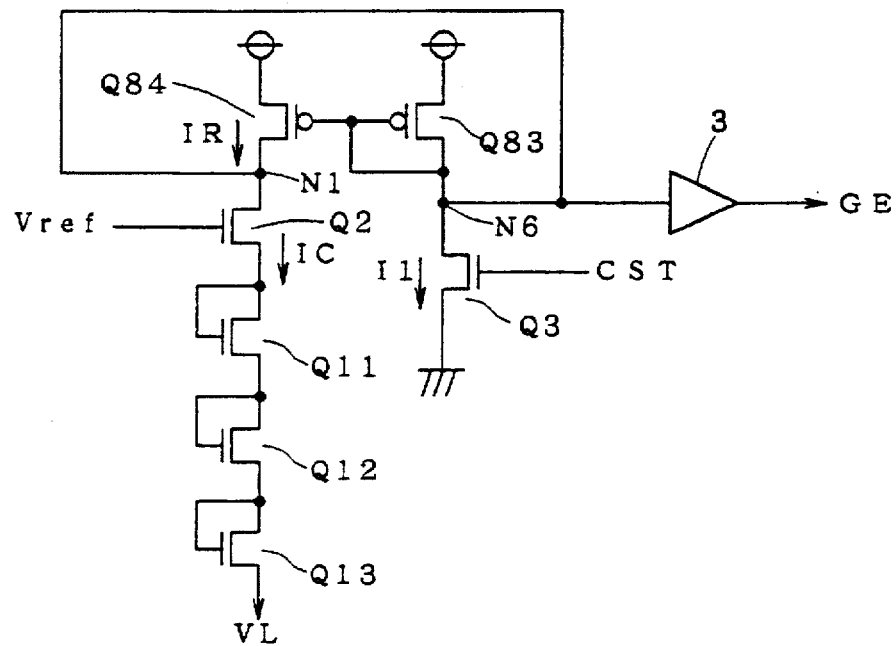
FIG. 10 is a circuit diagram of a configuration of a potential detecting circuit in accordance with a first aspect of a sixth preferred embodiment of the present invention.

FIG. 10 is a circuit diagram of a configuration of a potential detecting circuit in accordance with the first aspect of the sixth preferred embodiment of the present invention. As shown in FIG. 10, PMOS transistors Q83 and Q84, having sources connected to the power supply VCC and sharing a gate, constitute a current mirror circuit. The PMOS transistor Q83 has a connected gate and drain, and the drain of PMOS transistor Q83 is connected to a constant-current node N6. The drain of PMOS transistor Q84 is connected to the intermediate node N1.

The NMOS transistor Q3 serving as a variable current source is interposed between the constant-current node N6 and the ground level and its gate receives the control signal CST. The NMOS transistor Q3 supplies a constant current I1 between the constant-current node N6 and the ground level on the basis of the potential of the control signal CST.

The intermediate node N1 is connected to the drain of NMOS transistor Q2, and the gate of NMOS transistor Q2 is supplied with the reference potential Vref. The source of NMOS transistor Q2 is connected to the group of diode-connected NMOS transistors Q11 to Q13 which are connected in series. The comparison potential VL is supplied to the source of NMOS transistor Q13.

The amplifier 3 has the input connected to the intermediate node N1 and amplifies a potential from the intermediate node N1 to output the level detection signal GE.

In the potential detecting circuit having this configuration, the reference potential Vref is set and the amount of the comparison current IC flowing in the NMOS transistor Q2 is controlled on the basis of the reference potential Vref. The amount of the comparison current IC increases as the reference potential Vref rises, and the detection level for the comparison potential VL rises by the increase in current amount. The comparison current IC is supplied between the intermediate node N1 and the comparison potential VL, in other words, supplied towards the ground level.

With the current mirror circuit consisting of the PMOS transistors Q83 and Q84, the reference current IR, the amount of which is in proportion to the amount of the constant current 1, flows from the power supply VCC to the intermediate node N1.

Thus, like in the fifth preferred embodiment, it is possible to determine whether the comparison potential VL reaches the prescribed detection level or not depending on whether the level detection signal GE is H-level or L-level. The detection level is changeable by changing the comparison current IC flowing in the NMOS transistor Q2 on the basis of the reference potential Vref.

Moreover, since both the constant current It and the comparison current IC flow from the nodes (the constant-current node N6 or the intermediate node N1) to the ground level which is unaffected by the external noise, the respective amounts of the constant current I1 and the comparison current IC are unaffected by the external noise. The amount of the reference current IR provided by the current mirror circuit is accurately proportional to the amount of the constant current I1.

As a result, the potential detecting circuit of the first aspect of the sixth preferred embodiment achieves high accuracy in the respective amounts of the reference current IR and the comparison current IC against the external noise, thereby outputting the level detection signal with high accuracy.

Furthermore, since the constant current I1 has little variation, the reference current IR provided by the current mirror circuit has little variation and accordingly there occurs no noise when the constant current I1 is converted into the reference current IR by the current mirror circuit.

Thus, the potential detecting circuit of the first aspect of the sixth preferred embodiment achieves still higher accuracy in the respective amounts of the reference current IR and the comparison current IC against the external noise, thereby outputting the level detection signal with still higher accuracy.

<The Second Aspect>

Figure 11:
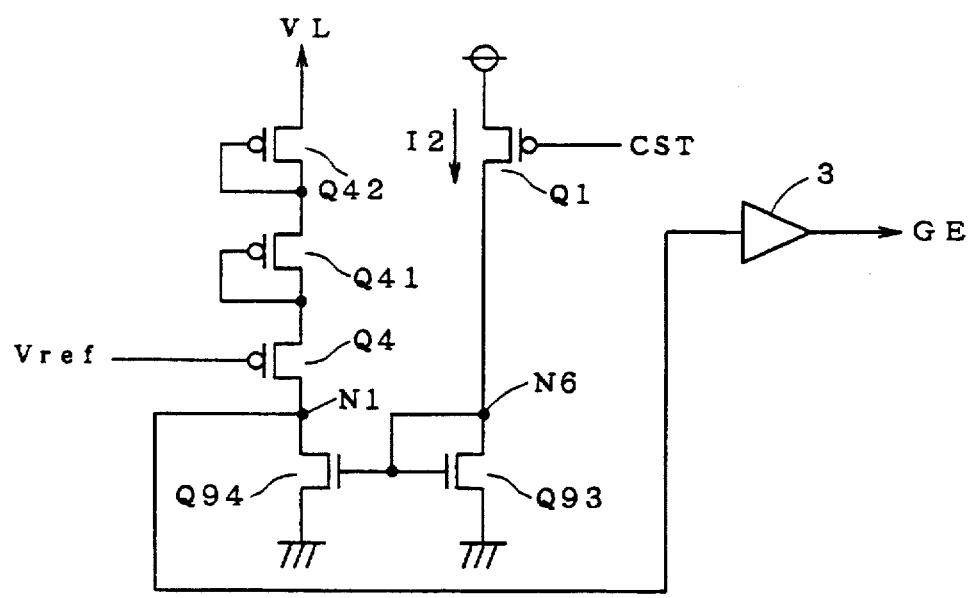
FIG. 11 is a circuit diagram of a configuration of a potential detecting circuit in accordance with a second aspect of the sixth preferred embodiment of the present invention.

FIG. 11 is a circuit diagram of a configuration of a potential detecting circuit in accordance with the second aspect of the sixth preferred embodiment of the present invention. As shown in FIG. 11, NMOS transistors Q93 and Q94, having sources connected to the ground level and sharing a gate, constitute a current mirror circuit. The NMOS transistor Q93 has a connected gate and drain, and the drain of NMOS transistor Q93 is connected to the constant-current node N6. The drain of NMOS transistor Q94 is connected to the intermediate node N1.

The PMOS transistor Q1 serving as a variable current source is interposed between the constant-current node N6 and the power supply VCC and its gate receives the control signal CST. The PMOS transistor Q1 supplies the constant current I2 between the power supply VCC and the constant-current node N6 on the basis of the potential of the control signal CST.

The intermediate node N1 is connected to the drain of PMOS transistor Q4, and the gate of PMOS transistor Q4 is supplied with the reference potential Vref. The source of PMOS transistor Q4 is connected to the diode-connected PMOS transistors Q41 and Q42 which are connected in series. The comparison potential VL is supplied to the source of PMOS transistor Q42.

The amplifier 3 has the input connected to the intermediate node N1 and amplifies a potential from the intermediate node N1 to output the level detection signal GE.

In the potential detecting circuit having this configuration, like in the first aspect, it is possible to determine whether the comparison potential VL reaches the prescribed detection level or not depending on whether the level detection signal GE is H-level or L-level. The detection level is changeable by changing the comparison current IC flowing in the PMOS transistor Q4 on the basis of the reference potential Vref.

Moreover, since the constant current I1 has little variation, the reference current IR provided by the current mirror circuit has little variation and accordingly there occurs no noise when the constant current I1 is converted into the reference current IR by the current mirror circuit.

As a result, the potential detecting circuit of the second aspect of the sixth preferred embodiment achieves high accuracy in the respective amounts of the reference current IR and the comparison current IC, thereby outputting the level detection signal with high accuracy.

Furthermore, the potential detecting circuit of the second aspect is suitable for a case of detection using a relatively high detection level and that of the first aspect is suitable for a case of detection using a relatively low detection level.

<The Seventh Preferred Embodiment>

Figure 12:
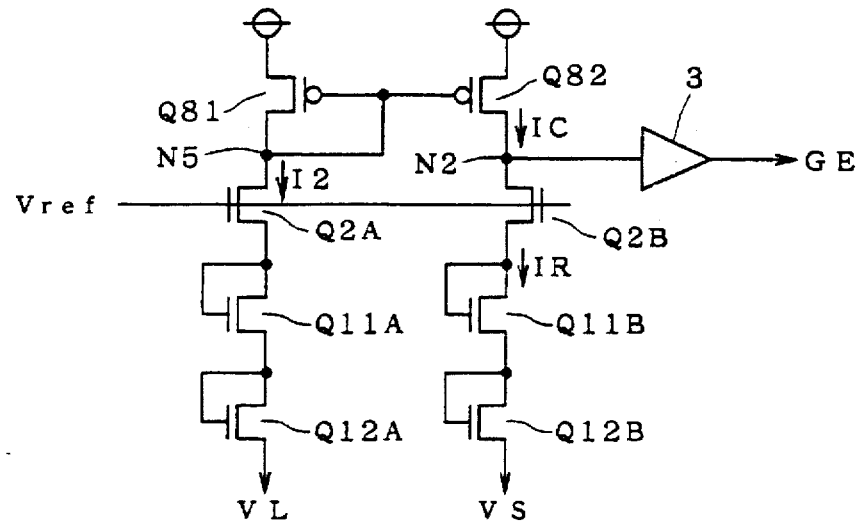
FIG. 12 is a circuit diagram of a configuration of a potential detecting circuit in accordance with a seventh preferred embodiment of the present invention.

FIG. 12 is a circuit diagram of a configuration of a potential detecting circuit in accordance with the seventh preferred embodiment of the present invention. As shown in FIG. 12, the PMOS transistors Q81 and Q82, having the sources connected to the power supply VCC and sharing the gate, constitute a current mirror circuit. The PMOS transistor Q81 has the connected gate and drain, and the drain of PMOS transistor Q81 is connected to the detection node N5. The drain of PMOS transistor Q82 is connected to the intermediate node N2.

The detection node N5 is connected to the drain of NMOS transistor Q2A, and the gate of NMOS transistor Q2A is supplied with the reference potential Vref. The source of NMOS transistor Q2A is connected to a group of diode-connected NMOS transistors Q1A and Q12A which are connected in series. The comparison potential VL is supplied to the source of NMOS transistor Q12A.

The intermediate node N2 is connected to the drain of NMOS transistor Q2B, and the gate of NMOS transistor Q2B is supplied with the reference potential Vref. The source of NMOS transistor Q2B is connected to a group of diode-connected NMOS transistors Q11B and Q12B which are connected in series. The source of NMOS transistor Q12B is supplied with a prospective set potential VS. The corresponding transistors, the NMOS transistors Q2A and Q2B, the NMOS transistors Q11A and Q11B and the NMOS transistors Q12A and Q12B, are of the same configuration.

The amplifier 3 has the input connected to the intermediate node N2 and amplifies a potential from the intermediate node N2 to output the level detection signal GE.

In the potential detecting circuit having this configuration, the reference potential Vref is set and the amount of the pre-comparison current I2 flowing in the NMOS transistor Q2A is controlled on the basis of the reference potential Vref. The amount of the pre-comparison current I2 increases as the reference potential Vref rises, and the detection level for the comparison potential VL rises by the increase in current amount. The pre-comparison current I2 is supplied between the detection node N5 and the comparison potential VL, in other words, supplied towards the ground level.

On the other hand, the amount of the reference current IR flowing in the NMOS transistor Q2B is controlled on the basis of the reference potential Vref. The amount of the reference current IR increases as the reference potential Vref rises. The reference current IR is supplied between the intermediate node N2 and a preset potential, in other words, supplied towards the ground level.

With the current mirror circuit consisting of the PMOS transistors Q81 and Q82, the comparison current IC, the amount of which is in proportion to the amount of the pre-comparison current I2, flows from the power supply VCC to the intermediate node N2.

The potential detecting circuit of the seventh preferred embodiment, like that of the fifth preferred embodiment, determines whether the comparison potential VL reaches the prescribed detection level or not depending on whether the level detection signal GE is H-level or L-level, and achieves the same effect as the potential detecting circuit of the fifth preferred embodiment.

Moreover, since the reference current IR is generated on the basis of the prospective set potential VS on the same condition as the pre-comparison current I2 is generated on the basis of the comparison potential VL, the detection level for the comparison potential VL is easily changed by changing the prospective set potential VS.

<The Eighth Preferred Embodiment>

Figure 13:
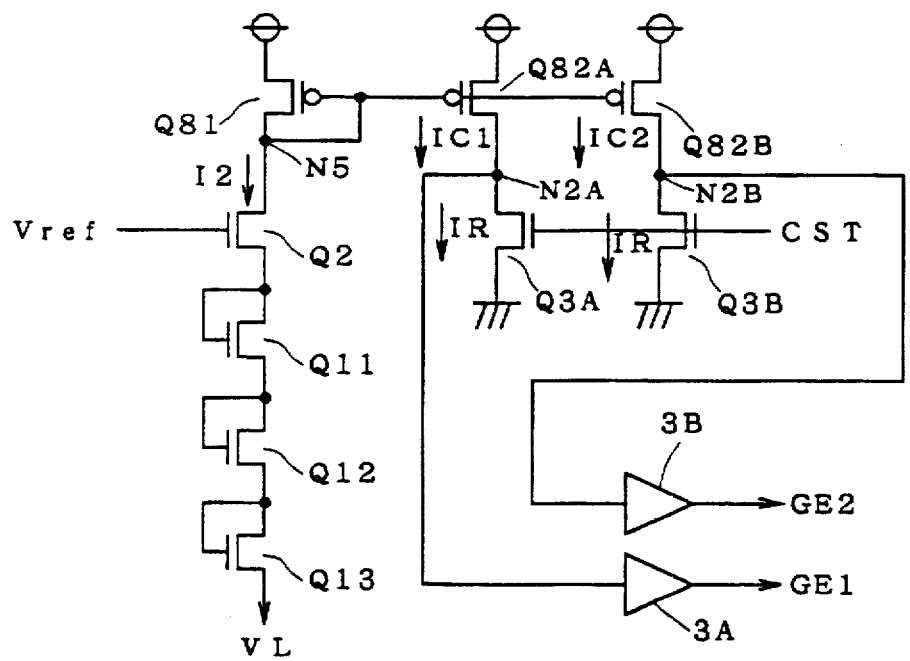
FIG. 13 is a circuit diagram of a configuration of a potential detecting circuit in accordance with an eighth preferred embodiment of the present invention.

FIG. 13 is a circuit diagram of a configuration of a potential detecting circuit in accordance with the eighth preferred embodiment of the present invention. As shown in FIG. 13, PMOS transistors Q81, Q82A and Q82B, having sources connected to the power supply VCC and sharing a gate, constitute a current mirror circuit. The PMOS transistor Q81 has a connected gate and drain, and the drain of PMOS transistor Q81 is connected to the detection node N5. The drains of PMOS transistors Q82A and Q82B are connected to the intermediate nodes N2A and N2B, respectively. Furthermore, the gate width of the PMOS transistor Q82B is larger than that of the PMOS transistor Q82A.

NMOS transistors Q3A and Q3B serving as variable current sources are interposed between the intermediate nodes N2A and N2B and the ground level, respectively, and their gates receive the control signal CST. The NMOS transistors Q3A and Q3B supply the reference current IR on the basis of the potential of the control signal CST between the intermediate current nodes N2A and N2B and the ground level, respectively.

The detection node N5 is connected to the drain of NMOS transistor Q2 and the gate of NMOS transistor Q2 is supplied with the reference potential Vref. The source of NMOS transistor Q2 is connected to the group of diode-connected NMOS transistors Q11 to Q13 which are connected in series. The comparison potential VL is supplied to the source of NMOS transistor Q13.

The amplifier 3A has an input connected to the intermediate node N2A and amplifies a potential from the intermediate node N2A to output the level detection signal GE1. The amplifier 3B has an input connected to the intermediate node N2B and amplifies a potential from the intermediate node N2B to output the level detection signal GE2.

In the potential detecting circuit having this configuration, the reference potential Vref is set and the amount of the pre-comparison current I2 flowing in the NMOS transistor Q2 is controlled on the basis of the reference potential Vref.

With the current mirror circuit consisting of the PMOS transistors Q81 and Q82, comparison currents IC1 and IC2, the amounts of which are in proportion to the amount of the pre-comparison current I2, flow from the power supply VCC to the intermediate nodes N2A and N2B, respectively.

Therefore, if the difference between the comparison potential VL and the power supply potential VCC is sufficiently small and the reference current IR is larger than the comparison currents IC1 and IC2, both the intermediate nodes N2A and N2B are discharged and potentials at the intermediate nodes N2A and N2B become lower than the logical threshold value of the amplifiers 3A and 3B, respectively. Consequently, the amplifiers 3A and 3B output the level detection signals GE1 and GE2 of L-level, respectively.

If the difference between the comparison potential VL and the power supply potential VCC is relatively large and the reference current IR is larger than the comparison current IC1 and smaller than the comparison current IC2, the intermediate node N2A is discharged and the intermediate node N2B is charged.

As a result, the potential at the intermediate node N2A becomes lower than the logical threshold value of the amplifier 3A and the amplifier 3A outputs the level detection signals GE1 of L-level, and the potential at the intermediate node N2B becomes higher than the logical threshold value of the amplifier 3B and the amplifier 3B outputs the level detection signals GE2 of H-level.

On the other hand, if the difference between the comparison potential VL and the power supply potential VCC is sufficiently large and the comparison currents IC1 and IC2 are larger than the reference current IR, both the intermediate nodes N2A and N2B are charged and the potentials at the intermediate nodes N2A and N2B become higher than the logical threshold value of the amplifiers 3A and 3B, respectively. Consequently, the amplifiers 3A and 3B output the level detection signals GE1 and GE2 of H-level, respectively.

Thus, the potential detecting circuit of the eighth preferred embodiment determines whether the comparison potential VL reaches the first and second detection levels or not at one time depending on whether the respective level detection signals GE1 and GE2 are H-level or L-level by providing the PMOS transistors Q82A and Q82B having different gate widths to render the respective amounts of the comparison currents IC1 and IC2 different. The first and second detection levels for the comparison potential VL are changeable by changing the pre-comparison current I2 flowing in the NMOS transistor Q2 on the basis of the reference potential Vref.

<The Ninth Preferred Embodiment>

Figure 14:
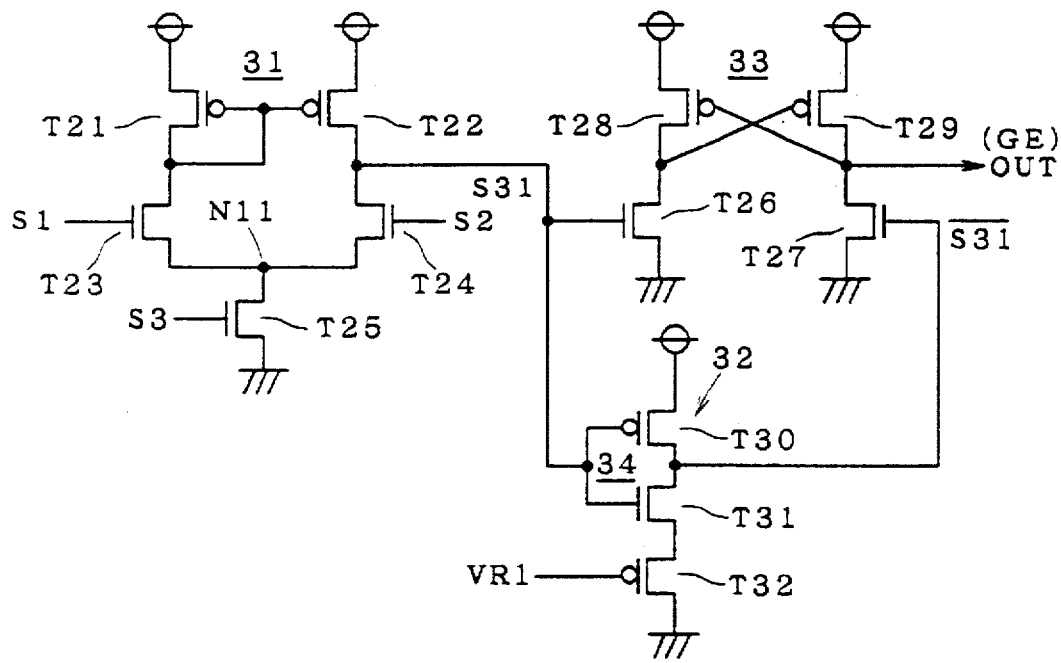
FIG. 14 is a circuit diagram of an internal configuration of an amplifier in a potential detecting circuit in accordance with a ninth preferred embodiment of the present invention.

FIG. 14 is a circuit diagram of an internal configuration of the amplifier 3 of a potential detecting circuit in accordance with the ninth preferred embodiment of the present invention. As shown in FIG. 14, the amplifier 3 includes a differential amplifier circuit 31, an inverter circuit 32 and a level converter circuit 33.

The differential amplifier circuit 31 consists of transistors T21 to T25, and the PMOS transistors T21 and T22, having sources connected to the power supply VCC and sharing a gate, constitute a current mirror circuit. The PMOS transistor T21 has a connected gate and drain, and the drain of PMOS transistor T21 is connected to the drain of NMOS transistor T23. The drain of PMOS transistor T22 is connected to the drain of NMOS transistor T24.

The gate of NMOS transistor T23 receives the first input signal S1 and the gate of NMOS transistor T24 receives the second input signal S2. In the potential detecting circuit of the fifth preferred embodiment of FIG. 8, for example, the signal from the intermediate node N2 is applied to the NMOS transistor T23 as the first input signal S1 and the signal from the detection node N5 is applied to the NMOS transistor T24 as the second input signal S2.

The sources of NMOS transistors T23 and T24 are connected in common to the drain of NMOS transistor T25 through the node N11. The gate of NMOS transistor T25 receives an activating signal S3 and the source thereof is grounded.

The differential amplifier circuit 31 amplifies a potential difference between the first and second input signals S1 and S2 to output an amplified signal S31 from the drain of PMOS transistor T22.

The inverter circuit 32 includes an inverter 34 provided between the power supply VCC and a PMOS transistor T32, consisting of a PMOS transistor T30 and an NMOS transistor T31.

The PMOS transistor T32 has a source connected to the source of NMOS transistor T31, a drain which is grounded and a gate supplied with a control potential VR1. The control potential VR1 is set so that a potential of the drain of PMOS transistor T32 may be almost equal to or more than the potential at the node N11.

The inverter has an input to receive the amplified signal S31, and inverts the amplified signal S31 to output an inverted amplified-signal $\overline{S31}$. Since the potential at the drain of PMOS transistor T32 is set almost equal to the potential at the node N11 of the differential amplifier circuit 31, the inverted amplified-signal $\overline{S31}$ is outputted without passing a needless through current in the inverter 34 even if the L-level of the amplified signal S31 becomes a little higher than the ground level.

The level converter circuit 33 consists of PMOS transistors T28 and T29 and NMOS transistors T26 and T27. The sources of PMOS transistors T28 and T29 are connected to the power supply VCC. The gate of PMOS transistor T28 is connected to the drain of NMOS transistor T27 and the gate of PMOS transistor T29 is connected to the drain of NMOS transistor T26. The gate of NMOS transistor T26 receives the amplified signal S31 and the source thereof is grounded. The gate of NMOS transistor T27 receives the inverted amplified-signal $\overline{S31}$ and the source thereof is grounded.

The level converter circuit 33 having this configuration outputs an output signal OUT whose H-level corresponds to the power supply potential VCC and L-level corresponds to the ground level potential as the level detection signal GE from the drain of transistor T27 on the basis of the amplified signal S31 and the inverted amplified-signal $\overline{S31}$.

<The Tenth Preferred Embodiment>

Figure 15:
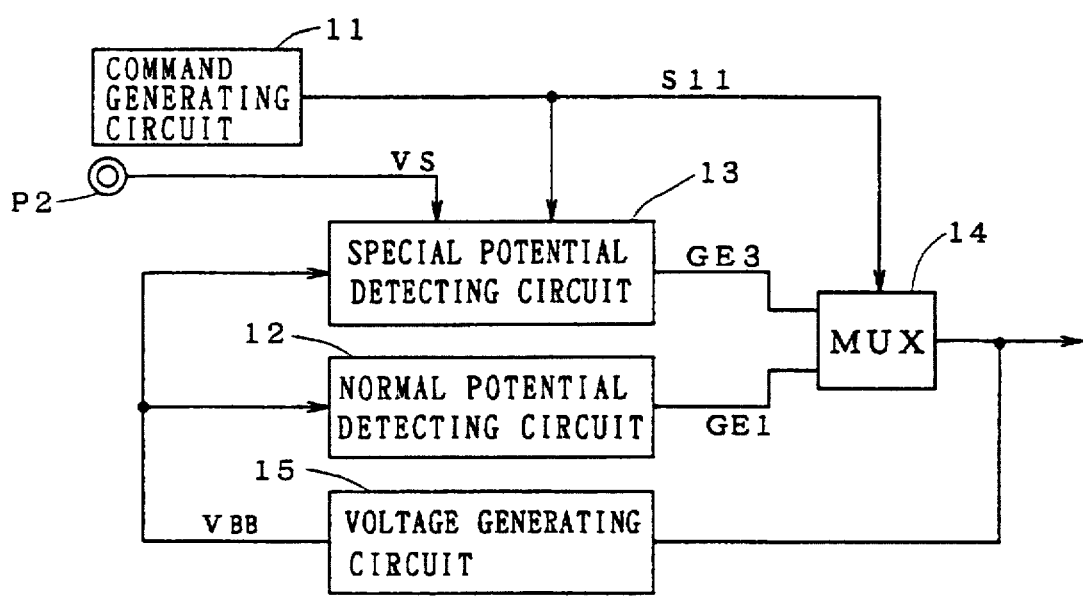
FIG. 15 is a block diagram of an internal configuration of a semiconductor integrated circuit in accordance with a tenth preferred embodiment of the present invention.

FIG. 15 is a block diagram of a configuration of a semiconductor integrated circuit in accordance with the tenth preferred embodiment of the present invention. As shown in FIG. 15, a command generating circuit 11 outputs a command S11 indicating which circuit should operate, a normal potential detecting circuit 12 or a special potential detecting circuit 13, to the special potential detecting circuit 13 and a multiplexer 14.

The normal potential detecting circuit 12, receiving a generation voltage VBB, determines whether the generation voltage VBB reaches an internally-set detection level to output the level detection signal GE1 to the multiplexer 14. The internal configuration of the normal potential detecting circuit 12 may adopt that of the potential detecting circuit as discussed in the first to sixth preferred embodiments.

The special potential detecting circuit 13, receiving the command S11 and the generation voltage VBB and further receiving the prospective set potential VS through an external input terminal P2, becomes active when the command S11 indicates the operation by the special potential detecting circuit 13 and becomes non-active when the command S11 indicates the operation by the normal potential detecting circuit 12. Then, the special potential detecting circuit 13, if active, determines whether the generation voltage VBB reaches the prospective set potential VS or not to output a level detection signal GE3 to the multiplexer 14. The internal configuration of the special potential detecting circuit 13 may adopt that of the potential detecting circuit as discussed in the seventh preferred embodiment.

The multiplexer 14, receiving the command S11, outputs the level detection signal GE1 to a voltage generating circuit 15 when the command S11 indicates the operation by the normal potential detecting circuit 12 and outputs the level detection signal GE3 to the voltage generating circuit 15 when the command S11 indicates the operation by the special potential detecting circuit 13.

The voltage generating circuit 15 is controlled whether to be active or non-active on the basis of the level detection signal GE1 or GE3, and generates the generation voltage VBB when active.

In the semiconductor integrated circuit having this configuration, the command generating circuit 11 outputs the command S11 indicating the operation by the normal potential detecting circuit 12 during a normal operation. Then, the level detection signal GE1 from the normal potential detecting circuit 12 as the result of the determination of the generation voltage VBB by the prescribed detection level is fed back to the voltage generating circuit 15. Consequently, the voltage generating circuit 15 generates the generation voltage VBB under the control of the level detection signal GE1. At this time, since the special potential detecting circuit 13 is non-active, power consumption is saved.

On the other hand, the command generating circuit 11 outputs the command S11 indicating the operation by the special potential detecting circuit 13 during a special operation. Then, the level detection signal GE3 from the special potential detecting circuit 13 as the result of determination of the generation voltage VBB by the externally-received prospective set potential VS is fed back to voltage generating circuit 15. Consequently, the voltage generating circuit 15 generates the generation voltage VBB under the control of the level detection signal GE3.

Thus, the semiconductor integrated circuit of the tenth preferred embodiment controls a voltage signal generated by the voltage generating circuit 15 on the basis of either the level detection signal GE1 from the normal potential detecting circuit 12 or the level detection signal GE3 from the special potential detecting circuit 13 in response to the command S11.

Figure 16:
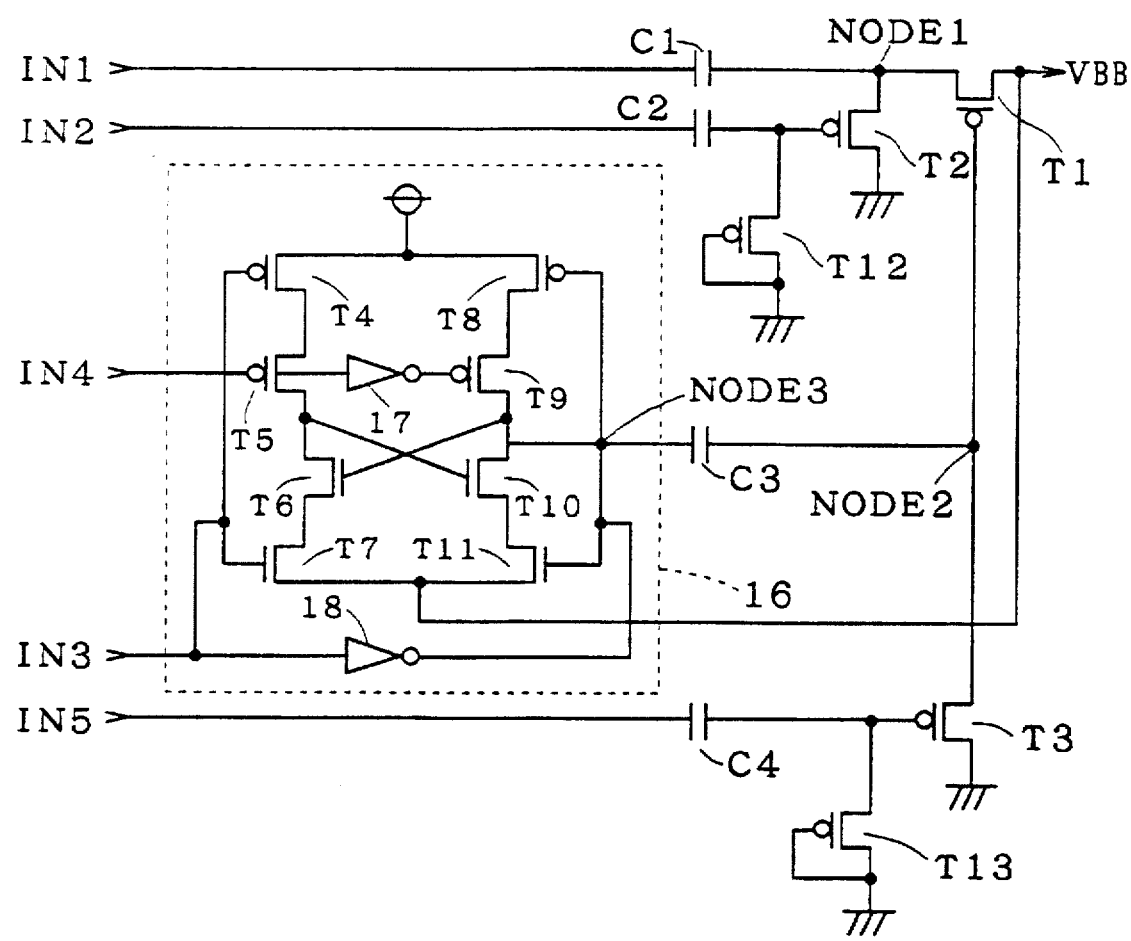
FIG. 16 is a circuit diagram of an internal configuration of a voltage generating circuit of FIG. 15.
Figure 17A:
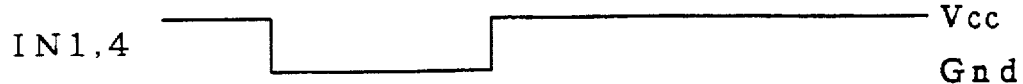
FIG. 17A–FIG. 17E are respectively timing charts of an operation of the voltage generating circuit of FIG. 16.
Figure 17B:
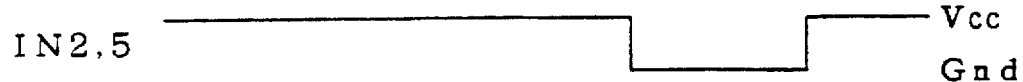
Figure 17C:
Figure 17D:
Figure 17E:
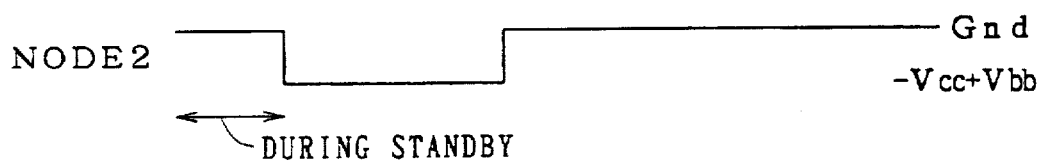

FIG. 16 is a circuit diagram of an internal configuration of the voltage generating circuit 15. The voltage generating circuit 15 receives five input signals IN1 to IN5, not shown in FIG. 15. The H-level of the input signals IN1 to IN5 corresponds to the power supply VCC and the L-level thereof corresponds to the ground level.

The voltage generating circuit 15 consists of a level converter circuit 16, PMOS transistors T1 to T3, T12 and T13 and capacitors C1 to C4, as shown in FIG. 16. The level converter circuit 16 consists of PMOS transistors T4, T5, T8 and T9, NMOS transistors T6, T7, T10 and T11 and inverters 17 and 18. The level converter circuit 16 has two clocked inverters (one consisting of transistors T4 to T7, the other of T8 to T11) using the power supply VCC and the generation voltage VBB as operation sources.

The operation of the voltage generating circuit 15 will be discussed below referring to the timing charts of FIG. 17A–FIG. 17E. During standby, all of the input signals IN1 to IN5 come into H-level and nodes NODE1 and NODE2 are precharged to the ground level. At this time, the transistor T1 is in an off-state.

In an active mode, the input signal IN1 becomes L-level and then a potential at the node NODE1 drops to −VCC. On the other hand, when the input signal IN3 becomes IL-level, the transistors T4 and T11 turn on, the transistor T8 turns off and the transistor T7 almost turns off. After that, the input signal IN4 becomes L-level, the transistors T5 and T10 turn on, the transistors T6 and T9 turn off and a potential at a node NODE3 is brought into (VBB−VCC). At this time, although both the transistors T5 and T6 are in an on-state for a certain period, there exists little through current passing since the transistor 17 has already almost turned off.

Then, a potential at the node NODE2 drops to (−VCC+VBB) and the transistor T1 turns on to output a potential at the node NODE1 as the generation voltage VBB.

In the semiconductor integrated circuit having this configuration, since the generation voltage VBB is fed back, the gate potential of the transistor T1 drops to (−VCC+VBB) and the gate-source voltage VGS of the transistor T1 which has the source potential VBB is not less than the threshold voltage, and accordingly the potential at the node NODE1 is outputted, without being changed, as the generation voltage VBB. The level converter circuit 16 operates using the input signals IN3 and IN4 and therefore passes no through current, ensuring high efficiency. The generation voltage VBB can be used for a substrate potential of a DRAM.

<The Eleventh Preferred Embodiment>

Figure 18:
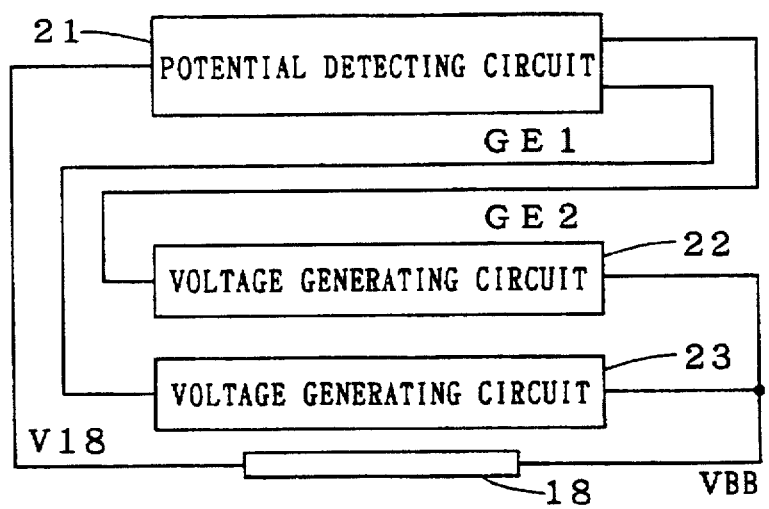
FIG. 18 is a block diagram of a configuration of a semiconductor integrated circuit in accordance with an eleventh preferred embodiment of the present invention.

FIG. 18 is a block diagram of a configuration of a semiconductor integrated circuit in accordance with the eleventh preferred embodiment of the present invention. As shown in FIG. 18, the potential detecting circuit 21, receiving a substrate potential V18 of a semiconductor substrate 18, determines whether the substrate potential V18 reaches the first and second detection levels DL1 and DL2 or not to output the level detection signals GE1 and GE2. The internal configuration of the potential detecting circuit 21 may adopt that of the potential detecting circuit as discussed in the eighth preferred embodiment.

A voltage generating circuit 22 outputs the generation voltage VBB of high current driving power to the semiconductor substrate 18 under the control of the level detection signal GE2, and a voltage generating circuit 23 outputs the generation voltage VBB of low current driving power to the semiconductor substrate 18 under the control of the level detection signal GE1.

Figure 19:
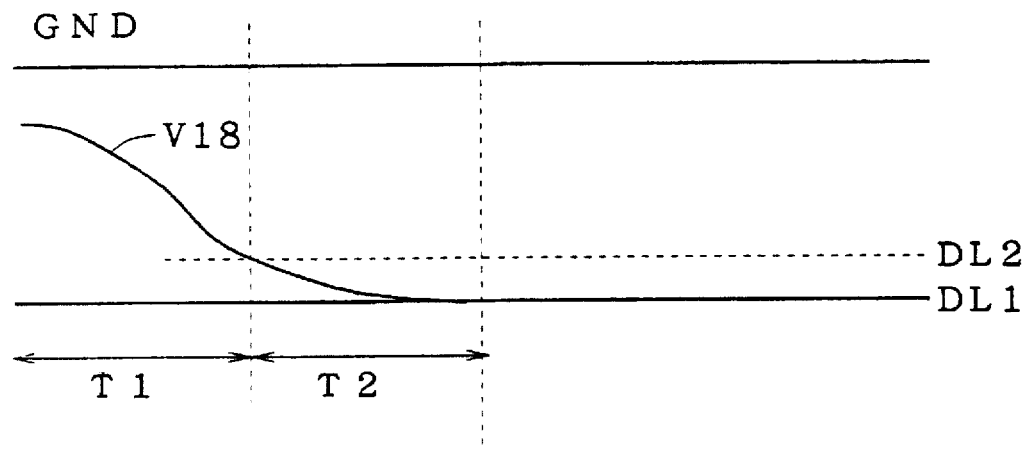
FIG. 19 is a waveform chart of an operation of a semiconductor integrated circuit of FIG. 18.
Figure 20:
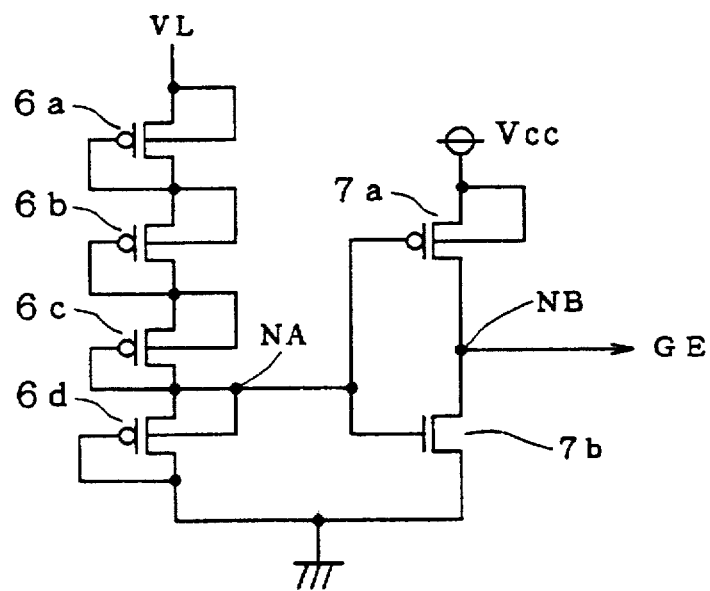
FIG. 20 is a circuit diagram of a configuration of a potential detecting circuit in the background art.

FIG. 19 is a waveform chart of an operation of the semiconductor integrated circuit of the eleventh preferred embodiment. The generation voltage VBB has a negative potential herein, and also the first and second detection levels each have a negative potential and there is a relation of DL2>DL1 therebetween. The semiconductor integrated circuit of this embodiment is eventually intended to set the substrate potential V18 to the potential DL1.

As shown in FIG. 19, during a period T1 while the substrate potential V18 is higher than the first and second detection levels DL1 and DL2, both the level detection signals GE1 and GE2 activate the voltage generating circuits 23 and 22, respectively, to generate the generation voltage VBB, thereby quickly dropping the substrate potential V18.

During a period T2 while the substrate potential V18 is lower than the detection level DL2, the level detection signal GE2 indicates non-activation, rendering the voltage generating circuit 22 non-active to stop generating the generation voltage VBB and only the voltage generating circuit 23 generates the generation voltage VBB, thereby gradually approximating the substrate potential V18 to the potential DL1.

Thus, the semiconductor integrated circuit of the eleventh preferred embodiment activates both or either of the voltage generating circuits 22 and 23 in response to the level detection signals GE1 and GE2 to change the current driving power of the generation voltage VBB, thereby approximating the substrate potential V18 to a desired prospective set potential VS quickly and accurately.

While the invention has been shown and described in detail, the foregoing description is in all aspects illustrative and not restrictive. It is therefore understood that numerous modifications and variations can be devised without departing from the scope of the invention.

We claim:

1. A potential detecting circuit which determines whether a comparison potential reaches a prescribed detection level or not, comprising:

reference current supplying means for supplying a reference current;

comparison current supplying means receiving said comparison potential, for supplying a comparison current, the amount of which is given by conversion of said comparison potential with a prescribed current conversion rate;

an intermediate node provided between said reference current supplying means and said comparison current supplying means so that one of said reference current and said comparison current flows in and the other flows out; and level detection signal outputting means for outputting a level detection signal on the basis of a potential at said intermediate node, wherein said comparison current supplying means can set said prescribed current conversion rate to a desired value after said potential detecting circuit is fabricated.

2. The potential detecting circuit of claim 1, wherein said comparison current supplying means includes variable resistor of which one end is connected to said intermediate node and the other end is supplied with said comparison potential.

3. The potential detecting circuit of claim 1, wherein said comparison current supplying means includes a transistor for comparison current of which one electrode is connected to said intermediate node, the other electrode is supplied with said comparison potential and a control electrode is supplied with a prescribed potential.

4. The potential detecting circuit of claim 1, wherein said comparison potential is a substrate potential of a prescribed semiconductor integrated circuit.

5. The potential detecting circuit of claim 1, wherein said reference current supplying means can set the amount of said reference current to a desired current amount after said potential detecting circuit is fabricated.

6. The potential detecting circuit of claim 5, wherein
said comparison current supplying means includes
first current converting means receiving a first control signal and having a first current conversion rate which varies on the basis of said first control signal; and
second current converting means receiving a second control signal and having a second current conversion rate which varies on the basis of said second control signal, and
said prescribed current conversion rate is a combination of said first current conversion rate and second current conversion rate.

7. The potential detecting circuit of claim 5, wherein
said prescribed current conversion rate varies on the basis of a current conversion control signal,
said potential detecting circuit further comprising
an external input terminal for receiving an externally-inputted signal; and
selecting means receiving said externally-inputted signal through said external input terminal and a selection signal, for selecting said externally-inputted signal on the basis of said selection signal to output said selected externally-inputted signal as said current conversion control signal.

8. The potential detecting circuit of claim 5, being connected to first and second power supplies, wherein
said reference current supplying means supplies said reference current between said intermediate node and said second power supply, and
said comparison current supplying means includes
a node for pre-comparison current;
pre-comparison current supplying means receiving said comparison potential, for supplying a pre-comparison current, the amount of which is given by conversion from said comparison potential into current, between said node for pre-comparison current and said second power supply; and
current mirror means for supplying said comparison current, the amount of which is in a prescribed proportion to the amount of said pre-comparison current, between said first power supply and said intermediate node in response to said pre-comparison current.

9. The potential detecting circuit of claim 8, wherein
said level detection signal outputting means includes
a differential amplifier circuit having a first input connected to said intermediate node and a second input supplied with a reference voltage, for outputting either a first logic H-level or a first logic L-level, a first logical potential difference existing therebetween, as an amplified signal on the basis of a difference between voltages received by said first and second inputs;
logic inverting means receiving said amplified signal, for logically inverting said amplified signal with a logical threshold value in conformity with said first logic H-level or said first logic L-level to output an inverted amplified-signal; and
level converter circuit receiving said amplified signal and said inverted amplified-signal, for outputting either a second logic H-level or a second logic L-level, a second logical potential difference larger than said first logical potential difference existing therebetween, as said level detection signal on the basis of a comparison result between said amplified signal and said inverted amplified-signal.

10. The potential detecting circuit of claim 9, wherein
said differential amplifier circuit includes
first load current supplying means having one end connected to a first power supply and the other end for supplying a first load current;
second load current supplying means having one end connected to a first power supply and the other end for supplying a second load current;
a first output control transistor having one electrode connected to said other end of said first load current supplying means and a control electrode which serves as said first input;
a second output control transistor having one electrode connected to said second other end of said second load current supplying means and a control electrode which serves as said second input, said amplified signal being a signal from one of said one electrodes of first and second output control transistors; and
an operation control transistor interposed between a first intermediate power-supply node which is the other electrode of said first and second output control transistors and a second power supply, said differential amplifier circuit becoming active when said operation control transistor is conducted, and
said logic inverting means includes
a second intermediate power-supply node;
an inverter circuit interposed between said first power supply and said second intermediate power-supply node; and
power-supply control means interposed between said second intermediate power-supply node and said second power supply, said power-supply control means setting a potential of said second intermediate power-supply node to be approximately equivalent to a potential of said first intermediate power-supply node of said differential amplifier circuit.

11. The potential detecting circuit of claim 8, wherein
said second power supply is unaffected by an external noise.

12. The potential detecting circuit of claim 5, being connected to first and second power supplies, wherein
said comparison current supplying means supplies said comparison current between said intermediate node and said second power supply, and
said reference current supplying means includes
a node for constant current;
constant current supplying means for supplying a constant current between said node for constant current and said second power supply; and
current mirror means for supplying said reference current, the amount of which is in proportion to the amount of said constant current, between said first power supply and said intermediate node in response to said constant current.

13. The potential detecting circuit of claim 12, wherein
said second power supply is unaffected by an external noise.

14. The potential detecting circuit of claim 5, wherein
said reference current supplying means receives a prospective set potential and supplies said reference current, the amount of which is given by conversion of said prospective set potential into current with said prescribed current conversion rate.

15. The potential detecting circuit of claim 14, wherein said comparison current supplying means includes a pre-comparison current supplying means for supplying a pre-comparison current, the amount of which is given by conversion of said comparison potential into current with said prescribed current conversion rate; and current mirror means receiving said pre-comparison current, for supplying said comparison current, the amount of which is in proportion to the amount of said pre-comparison current.

16. The potential detecting circuit of claim 8, further comprising:

second reference current supplying means for supplying a second reference current;

second current mirror means for supplying a second comparison current, the amount of which is in proportion to the amount of said pre-comparison current with a second rate, in response to said pre-comparison current;

a second intermediate node provided between said second reference current supplying means and said second current mirror means so that one of said second reference current and said second comparison current flows in and the other flows out; and second level detection signal outputting means for outputting a second level detection signal on the basis of a potential at said second intermediate node.

17. The potential detecting circuit of claim 12, wherein said level detection signal outputting means includes a differential amplifier circuit having a first input connected to said intermediate node and a second input supplied with a reference voltage, for outputting either a first logic H-level or a first logic L-level, a first logical potential difference existing therebetween, as an amplified signal on the basis of a difference between voltages received by said first and second inputs;

logic inverting means receiving said amplified signal, for logically inverting said amplified signal with a logical threshold value in conformity with said first logic H-level or said first logic L-level to output an inverted amplified-signal; and level converter circuit receiving said amplified signal and said inverted amplified-signal, for outputting either a second logic H-level or a second logic L-level, a second logical potential difference larger than said first logical potential difference existing therebetween, as said level detection signal on the basis of a comparison result between said amplified signal and said inverted amplified-signal.

18. The potential detecting circuit of claim 17, wherein said differential amplifier circuit includes first load current supplying means having one end connected to a first power supply and the other end for supplying a first load current;

second load current supplying means having one end connected to a first power supply and the other end for supplying a second load current;

a first output control transistor having one electrode connected to said other end of said first load current supplying means and a control electrode which serves as said first input;

a second output control transistor having one electrode connected to said other end of said second load current supplying means and a control electrode which serves as said second input, said amplified signal being a signal from one of said one electrodes of first and second output control transistors; and an operation control transistor interposed between a first intermediate power-supply node which is the other electrode of said first and second output control transistors and a second power supply, said differential amplifier circuit becoming active when said operation control transistor is conducted, and said logic inverting means includes a second intermediate power-supply node;

an inverter circuit interposed between said first power supply and said second intermediate power-supply node; and power-supply control means interposed between said intermediate power-supply node and said second power supply, said power-supply control means setting a potential of said second intermediate power-supply node to be approximately equivalent to a potential of said first intermediate power-supply node of said differential amplifier circuit.

19. A semiconductor integrated circuit, comprising:

voltage signal generating means receiving a voltage control signal, for generating a voltage signal on the basis of said voltage control signal; and first and second potential detecting circuits for determining whether a comparison potential which is a potential of said voltage signal reaches a prescribed detection level or not, wherein said first and second potential detecting circuits each include reference current supplying means for supplying a reference current;

comparison current supplying means receiving said comparison potential, for supplying a comparison current, the amount of which is given by conversion of said comparison potential with a prescribed current conversion rate;

an intermediate node provided between said reference current supplying means and said comparison current supplying means so that one of said reference current and said comparison current flows in and the other flows out; and level detection signal outputting means for outputting a level detection signal on the basis of a potential at said intermediate node, said comparison current supplying means setting said prescribed current conversion rate to a desired value, and said reference current supplying means of said second potential detecting circuit further receiving a prospective set potential, for supplying said reference current, the amount of which is given by conversion of said prospective set potential into current with said prescribed current conversion rate, said semiconductor integrated circuit further comprising:

voltage control signal outputting means receiving an instruction signal, for outputting either of level detection signals from said first and second potential detecting circuits as said voltage control signal on the basis of said instruction signal.

20. A semiconductor integrated circuit, comprising:

a potential detection circuit which determines whether a comparison potential reaches a prescribed detection level or not, including reference current supplying means for supplying a reference current, comparison current supplying means receiving said comparison potential, for supplying a comparison current, the amount of which is given by conversion of said comparison potential with a prescribed current conversion rate, an intermediate node provided between said reference current supplying means and said comparison current supplying means so that one of said reference current and said comparison current flows in and the other flows out, and level detection signal outputting means for outputting a level detection signal on the basis of a potential at said intermediate node, wherein said comparison current supplying means can set said prescribed current conversion rate to a desired value after said potential detecting circuit is fabricated, said reference current supplying means can set the amount of said reference current to a desired current amount after said potential detecting circuit is fabricated, said potential detecting circuit is connected to first and second power supplies, said reference current supplying means supplies said reference current between said intermediate node and said second power supply, said comparison current supplying means includes
a node for pre-comparison current,
pre-comparison current supplying means receiving said comparison potential, for supplying a pre-comparison current, the amount of which is given by conversion from said comparison potential into current, between said node for pre-comparison current and said second power supply, and
current mirror means for supplying said comparison current, the amount of which is in a prescribed proportion to the amount of said pre-comparison current, between said first power supply and said intermediate node in response to said pre-comparison current, said potential detecting circuit further including
second reference current supplying means for supplying a second reference current,
second current mirror means for supplying a second comparison current, the amount of which is in proportion to the amount of said pre-comparison current with a second rate, in response to said pre-comparison current,
a second intermediate node provided between said second reference current supplying means and said second current mirror means so that one of said second reference current and said second comparison current flows in and the other flows out, and
second level detection signal outputting means for outputting a second level detection signal on the basis of a potential at said second intermediate node;

first voltage generating means controlled whether to be active or non-active on the basis of said level detection signal, for generating a first voltage with a first current driving power in an active state;

second voltage generating means controlled whether to be active or non-active on the basis of a second level detection signal, for generating a second voltage with a second current driving power larger than said first current driving power in an active state; and a substrate receiving said first and second voltages, a voltage of said substrate serving as said comparison potential.

* * * * *